(12) United States Patent
Rotholz

(10) Patent No.: US 10,578,142 B2
(45) Date of Patent: *Mar. 3, 2020

(54) CORRUGATED FIBERBOARD CONSTRUCTIONS

(71) Applicant: Zachary Rotholz, New Haven, CT (US)

(72) Inventor: Zachary Rotholz, New Haven, CT (US)

( * ) Notice: Subject to any disclaimer, the term of this patent is extended or adjusted under 35 U.S.C. 154(b) by 88 days.

This patent is subject to a terminal disclaimer.

(21) Appl. No.: 15/443,505

(22) Filed: Feb. 27, 2017

(65) Prior Publication Data

US 2017/0234347 A1   Aug. 17, 2017

Related U.S. Application Data

(63) Continuation of application No. 13/530,349, filed on Jun. 22, 2012, now Pat. No. 9,585,482.

(Continued)

(51) Int. Cl.

| A47C 4/02 | (2006.01) |
| A47C 5/00 | (2006.01) |
| F16B 12/46 | (2006.01) |
| B31D 5/04 | (2017.01) |
| B26D 3/00 | (2006.01) |

(Continued)

(52) U.S. Cl.
CPC ............... *F16B 12/46* (2013.01); *A47B 3/06* (2013.01); *A47C 4/02* (2013.01); *A47C 4/021* (2013.01); *A47C 5/005* (2013.01); *B26D 3/00* (2013.01); *B26D 3/08* (2013.01); *B26D 5/005* (2013.01); *B26F 1/382* (2013.01); *B31D 5/04* (2013.01); *G06F 17/50* (2013.01); *G06Q 30/0621* (2013.01); *G06Q 30/0643* (2013.01); *Y10T 83/0207* (2015.04); *Y10T 403/7096* (2015.01)

(58) Field of Classification Search
CPC ............................... A47C 4/021; A47C 5/005
USPC ........ 297/440.12, 440.13; 108/115; 312/259, 312/262
See application file for complete search history.

(56) References Cited

U.S. PATENT DOCUMENTS

| 2,940,513 A | 6/1960 | Holden |
| 2,955,647 A | 10/1960 | Smith |

(Continued)

OTHER PUBLICATIONS

U.S. Appl. No. 13/530,349, filed Jun. 22, 2012, Timothy J. Brindley.

(Continued)

*Primary Examiner* — Timothy J Brindley
(74) *Attorney, Agent, or Firm* — Fish & Richardson P.C.

(57) ABSTRACT

Among other things, a piece of furniture is formed from three separate precut pieces of flat cardboard. A first one of the pieces has a bottom edge to rest on a floor with the first piece rising vertically from the bottom edge and has at least one slot at an upper edge of the first piece. A second one of the pieces has a bottom edge to rest on the floor with the second piece rising from the bottom edge and having at least one slot at an upper edge of the second piece. A third one of the pieces has a crease across the piece and at least two slots along at least one edge that is parallel to the fold. The piece of furniture is formed by mating the one slot in the first piece with one of the slots of the third piece, folding the third piece of cardboard at the crease, and mating the one slot in the second piece with another one of the slots of the third piece, with the third piece folded along the crease.

14 Claims, 19 Drawing Sheets

Related U.S. Application Data

(60) Provisional application No. 61/500,369, filed on Jun. 23, 2011.

(51) Int. Cl.

| | |
|---|---|
| *G06Q 30/06* | (2012.01) |
| *A47B 3/06* | (2006.01) |
| *B26D 3/08* | (2006.01) |
| *B26D 5/00* | (2006.01) |
| *B26F 1/38* | (2006.01) |
| *G06F 17/50* | (2006.01) |

(56) References Cited

U.S. PATENT DOCUMENTS

| | | |
|---|---|---|
| 3,212,464 A | 10/1965 | Steuer |
| 3,695,703 A | 10/1972 | Notko |
| 3,717,377 A | 2/1973 | Johnson |
| 3,729,244 A | 4/1973 | Butler |
| 3,837,719 A | 9/1974 | Barron |
| 3,871,726 A | 3/1975 | Stegner |
| 4,340,251 A | 7/1982 | Geoffroy-Dechaume |
| 4,546,941 A | 10/1985 | Hildebrand |
| 4,841,882 A | 6/1989 | Ehrman |
| 4,934,756 A | 6/1990 | Webb et al. |
| 5,263,766 A | 11/1993 | McCullough |
| 5,394,810 A | 3/1995 | Howard et al. |
| 5,795,027 A | 8/1998 | Howard et al. |
| 5,860,704 A | 1/1999 | Smith |
| 6,161,901 A | 12/2000 | Avner |
| 8,240,770 B2 | 8/2012 | Bertele |
| 8,403,422 B2 | 3/2013 | Wu |
| 8,602,500 B1 | 12/2013 | Warren |
| 8,740,308 B2 | 6/2014 | Leywood et al. |
| 2006/0061191 A1 | 3/2006 | Pelletier |
| 2008/0157582 A1 | 7/2008 | Bertele |
| 2009/0251034 A1 | 10/2009 | Nielsen et al. |

OTHER PUBLICATIONS

Patent Application from corresponding U.S. Appl. No. 13/530,349, filed Jun. 22, 2012, pp. 1-17.

Transaction history from corresponding U.S. Appl. No. 13/530,349.

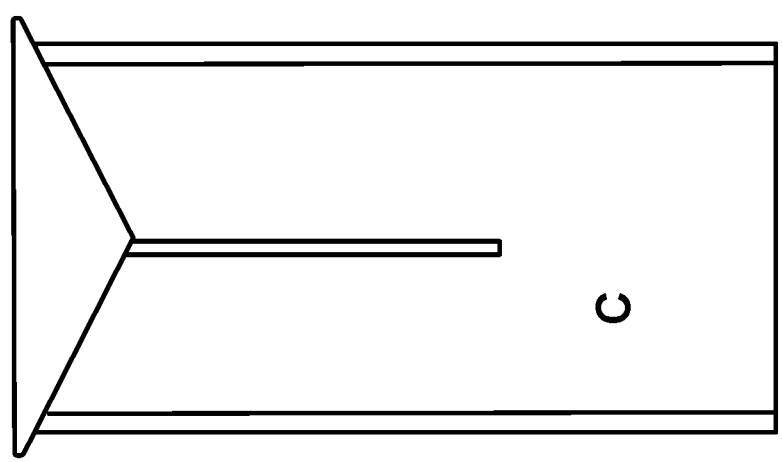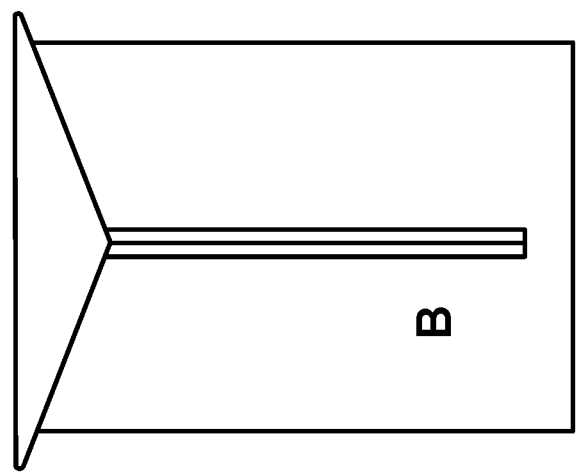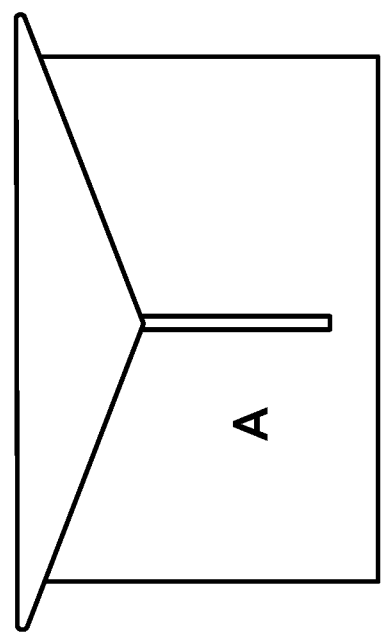
FIG. 10

CORRUGATED FIBERBOARD CONSTRUCTIONS

This application is a continuation of and claims priority under 35 U.S.C. § 120 to U.S. patent application Ser. No. 13/530,349, filed Jun. 22, 2012 which is entitled to the priority of the date of U.S. provisional patent application Ser. 61/500,369, filed Jun. 23, 2011, both of which are incorporated here in their entirety by reference.

BACKGROUND

This description relates to corrugated fiberboard constructions.

Known furniture systems typically include complex assembly procedures, consist of multiple parts, and require tools and fasteners for assembly. Known furniture systems often utilize materials that are difficult, if not impossible to recycle, are not produced from sustainable materials and processes, and are expensive.

Corrugated fiberboard (which we sometimes refer to simply as cardboard) has long been used for shipping and transit. The material is recyclable, sustainable, and lightweight, and provides an inexpensive means to package items. Designers have used corrugated fiberboard for furniture and toys for both children and adults. This furniture is easy to move, can be flat-packed when not assembled, and is readily customizable with pens or paints.

Cardboard furniture is typically made from single wall or double wall corrugated fiberboard. Single wall has a fluted layer sandwiched between two kraft liners, and double wall has two fluted layers sandwiched between three kraft layers. Double wall and single wall corrugated fiberboard furniture may not support heavy loads and may not be resilient under fatigue loading. Because of this deficit in strength, some corrugated furniture designs include complicated and intricate features to support heavy loads.

A stronger and more resilient more durable corrugated fiberboard, called triple wall, has three fluted layers sandwiched between four kraft liners. This board affords simpler furniture designs, fewer parts, and longer lasting pieces. Triple wall, however, may be difficult to cut by usual die-cutting methods. Die-cutting can crush the edges of the triple wall board leaving slots that are weak and yield inaccurate dimensions. Furniture made from triple wall may be prone to side load fatigue failure. Short, slotted triple wall joints may only restrict movement in one plane and may result in shortened life of the furniture. The use of resilient joints that may extend the life of the furniture tend to be more complicated to assemble and to manufacture.

SUMMARY

In general, in an aspect, an apparatus includes three separate pieces of cut flat cardboard. A first one of the pieces has a bottom edge to rest on a floor with the first piece rising vertically from the bottom edge and has at least one slot at an upper edge of the first piece. A second one of the pieces has a bottom edge to rest on the floor with the second piece rising from the bottom edge and has at least one slot at an upper edge of the second piece. A third one of the pieces has a crease across the piece and at least two slots along at least one edge that is parallel to the fold. The one slot in the first piece is configured to mate with one of the slots of the third piece. The one slot in the second piece is configured to mate with another one of the slots of the third piece, with the third piece folded along the crease. A piece of furniture is formed in which the first and second pieces serve as legs and the third piece as a surface supported by the legs.

Implementations may include one or more of the following features. The surface supported by the legs includes a seating surface. The surface supported by the legs includes a work surface. The cardboard for each of at least one of the pieces include triple wall fiberboard. The third piece of cardboard has two or more parallel creases, has at least one slot along an edge of the third piece that is parallel to the slots, and has at least another slot along another edge of the cardboard that is also parallel to the crease. The one slot and the other slot mate with corresponding slots in one or the other or both of the first and second pieces of cardboard. The first and second pieces of cardboard rise vertically from the floor. The surface of the third piece lies horizontally. Two or more slots of the third piece mate together with a single slot of the first piece or the second piece. The fourth piece of cardboard has a crease and at least one slot along one edge of the fourth piece that is parallel to the crease and is configured to mate with a slot of the first piece or the second piece. The fourth piece provides a back-supporting surface. The apparatus is self-supporting without any separate fasteners when the three pieces of cardboard are assembled at the slots.

In general, in an aspect, an apparatus includes a range of tables or seats of similar configuration. Each of the tables or seats in the range is assembled of at least three separate pieces of folded cardboard, two of the pieces forming legs of the table or seat, and the third piece forming a supporting surface. The pieces are assembled by folding at least one of the pieces and by the mating of slots that have been cut in edges of the pieces. The tables or seats of the range differing in scale, or length, or height, or two or more of those.

Implementations may include one or more of the following features. At least some pieces of the range that are larger along a direction of the supporting surface have additional pieces forming additional legs. At least some pieces of the range that are taller have additional pieces that brace the legs. At least some pieces of the range include supplemental cardboard features. The supplemental cardboard features include shelves or arms.

In general, in an aspect, a piece of furniture is formed from three separate precut pieces of flat cardboard. A first one of the pieces has a bottom edge to rest on a floor with the first piece rising vertically from the bottom edge and has at least one slot at an upper edge of the first piece. A second one of the pieces has a bottom edge to rest on the floor with the second piece rising from the bottom edge and having at least one slot at an upper edge of the second piece. A third one of the pieces has a crease across the piece and at least two slots along at least one edge that is parallel to the fold. The piece of furniture is formed by mating the one slot in the first piece with one of the slots of the third piece, folding the third piece of cardboard at the crease, and mating the one slot in the second piece with another one of the slots of the third piece, with the third piece folded along the crease.

Implementations may include one or more of the following features. The first and second pieces serve as legs and the third piece as a surface supported by the legs. The third piece has additional creases and forming the piece of furniture includes folding the third piece at the other creases. A slot of a fourth piece of cardboard is mated with a slot of the first piece of cardboard and another slot of the fourth piece of cardboard is mated with a slot of the second piece of cardboard. The fourth piece of cardboard forms a back support.

In general, in an aspect, an online user is enabled to identify a standard item or class of furniture that can be assembled from at least three standard pieces of flat precut cardboard at least one of the pieces having a crease along which the piece is to be folded. The user is enabled to specify alterations of at least one of the shape, aspect ratio, scale, size, coating, graphic, text, or decoration of the item or class of furniture. Automatically by computer data is generated for production of custom versions of one or more of the pieces of flat precut cardboard in accordance with the specified alterations.

Implementations may include one or more of the following features. The user is enabled to buy pieces of cardboard that comply with the generated data.

In general, in an aspect, a cutting table is used to cut out from one or more sheets of triple wall fiberboard at least three pieces of flat cardboard. The cut pieces include assembly slots. The cut pieces conform to piece patterns that permit the pieces to be assembled into a pre-designed three-dimensional item of furniture without requiring any additional fasteners. At least one of the three pieces is creased along one or more pre-specified creases along which the piece is to be folded during assembly of the item of furniture.

Implementations may include one or more of the following features. The decorative content is applied to at least one of the pieces. The pieces are flat packed for shipment to a location where the item of furniture is to be assembled.

These and other aspects, features, and implementations can be expressed as methods, apparatus, methods of doing business, systems, components, program products, means or steps for performing functions and in other ways.

Other aspects, features, implementations, and advantages will become apparent from the following description, and from the claims.

DESCRIPTION

FIG. 10 is an isometric view of a drafting table variation of a table.

Here, among other things, we describe individual pieces of and sets of furniture and furnishings made of, for example, triple wall corrugated fiberboard (cardboard) and ways to design and make them. These furniture and furnishings designs support a low cost and mobile lifestyle because they are lightweight, recyclable, can be flat packed when not assembled, and are intuitive and quick to assemble. Because the primary material of designs described here is triple wall corrugated fiberboard, the furniture and furnishings can be assembled (and disassembled) easily and quickly without the use of special tools, fasteners, or adhesives. The nature of at least some of the designs for seating and tables can be easily altered in terms of, for example, their aspect ratio to yield designs that have various purposes such as lounge seating and coffee tables, office chairs and desks, and standing work stations. The basic designs are easily altered to provide flexible seating and tables tailored to various postures, body types, and interior environments.

The designs take advantage of the fact that triple wall fiberboard, though stiff, can be bent and folded. By combining folding and slot-in-slot construction techniques, the designs increase lateral support by securing intersecting pieces in several movement planes at once and embody different versions of a unique, overarching design principle for seating and table units. Similar designs and design and manufacturing techniques can also be applied to accessories, furnishings, and non-furniture products.

In some examples, the designs can be fabricated from pieces of triple wall corrugated fiberboard that need not be die cut. Instead, line-following cutting tables with oscillating blades and folding wheels can be used to cut and form the pieces that are then assembled to make the furniture and furnishings. Though usually reserved for rapid corrugated prototyping and not for mass produced high volume manufacturing runs, such cutting tables can be used to cut and fold pieces to produce cardboard furniture that is tailored to each customer's needs, furniture that is more ergonomic and more suited for its intended use.

The Internet has enabled mass customization by consumers through user-friendly software interfaces, allowing people to personalize products (such as shoes) to fit their sense of style and body type. Items of triple wall corrugated furniture and furnishings that are individually produced using cutting tables take well to screen-printed designs and lettering. These techniques offer the opportunity for a new furniture sector that is at once customizable, lightweight, affordable, and recyclable. The combination of a flexible set of furniture designs and an easily customizable furniture manufacturing method can bring mass customization to the furniture and furnishings industry.

Figure 1:
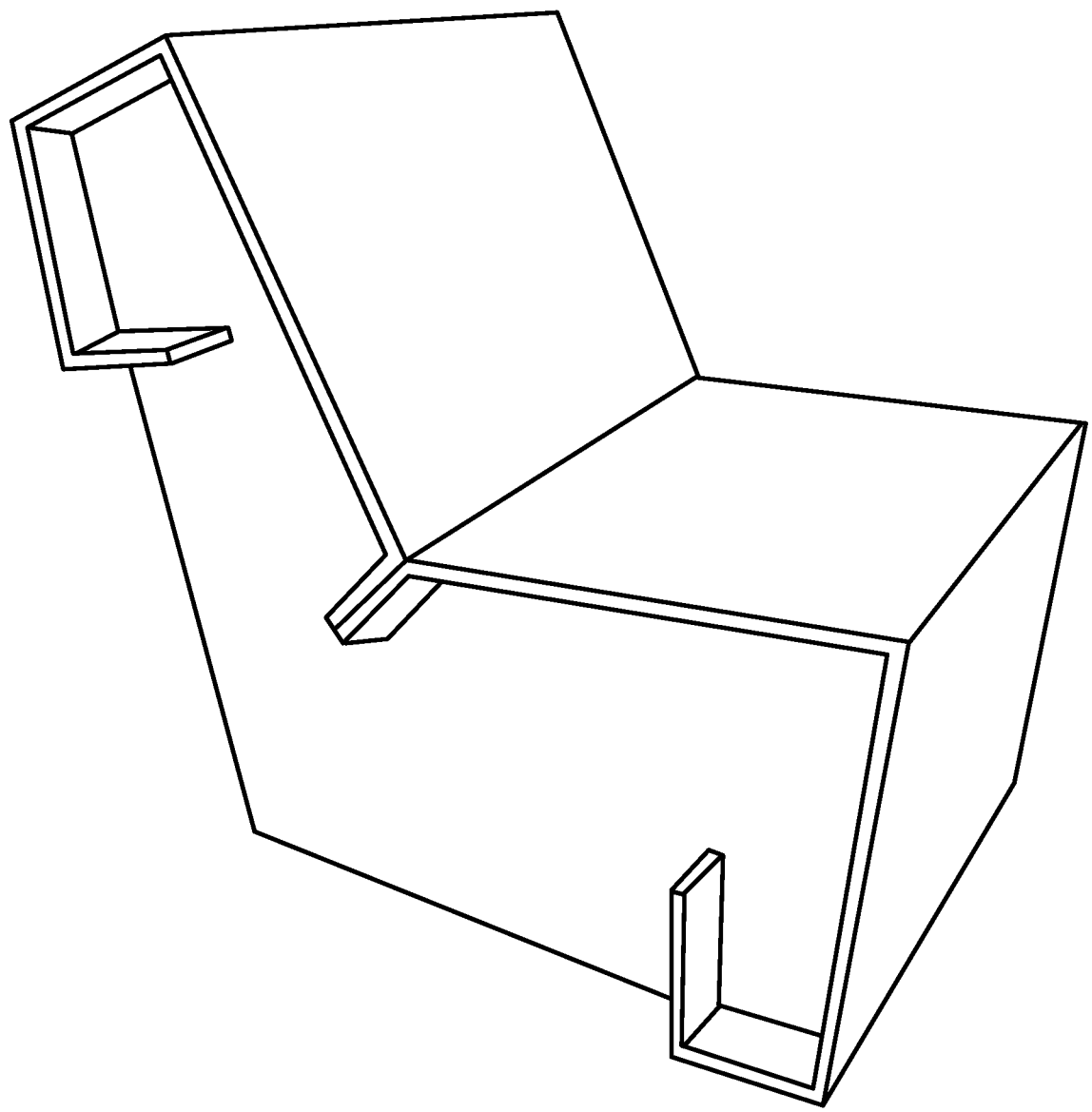
FIG. 1 is an isometric view of an assembled chair.
Figure 2:
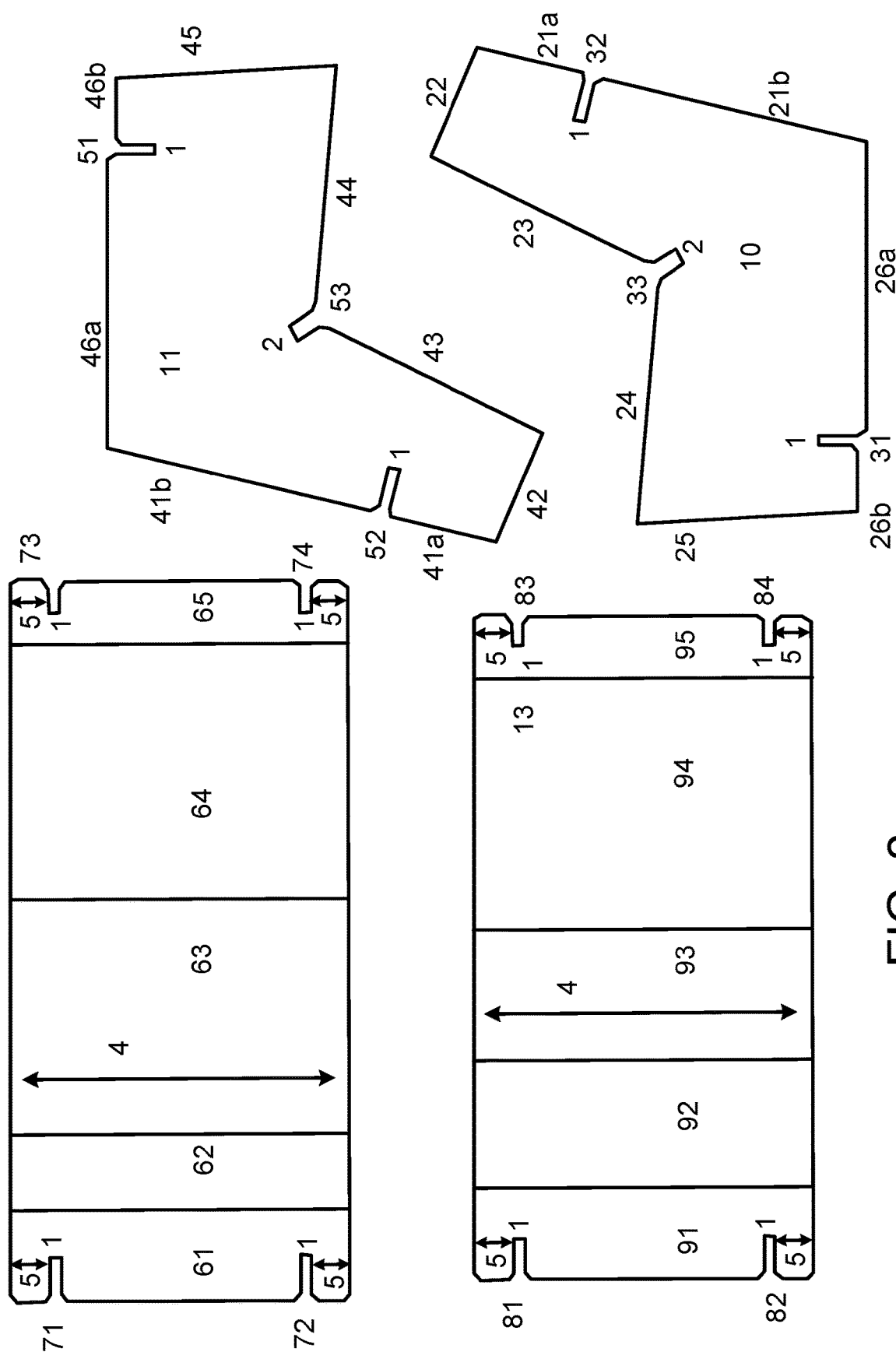
FIG. 2 is a disassembled and unfolded view of parts of the chair.

Seating Parts:

A simple basic implementation of a chair design is shown in FIG. 1 (assembled and ready for use); its disassembled parts are shown in FIG. 2. The chair includes four pieces: two identical vertical supports 10, 11, a seat span 12, and a back span 13. All corners are chamfered to reduce corner crush damage during the lifespan of the product. Each of the vertical supports has six sides 21, 22, 23, 24, 25, 26; 41, 42, 43, 44, 45, 46 and three slot joints each 31, 32, 33; 51, 52, 53.

The vertical supports represent a cross-section of the chair in elevation view. The two outer slot joints, one top slot joint 32, 52 and one bottom slot joint 31, 51 are single slots; each of these slots has width 1 that can only accommodate one corresponding triple wall fiberboard slot piece either from the seat span or the back span. The double slot joint 33, 53 that lies at the junction of the seat span and the back span must accommodate a pair of slots from the seat span and the back span and has a width of 2 to accommodate the pair of triple wall fiberboard slots of the seat and back spans. The vertical supports have inset channels 26b, 46b such that when assembled the seat span lies flush with the remainder of side 26a, 46a. The chair has increased stability with these channels, such that the chair base is completely flush with the ground.

The vertical supports take advantage of particular shipping dimensional constraints (the overall maximum sizes of a package of a given cost) and have a convenient nesting shape (the two vertical supports nest to some extent within a surface of a single piece of cardboard) which limits waste material during large scale production. The three slots 31, 32, 33, 51, 52, 53 are placed an adequate distance apart to provide efficient lateral support and are oriented in three different directions to provide support along three movement planes.

The seat span 12 and the back span 13 are large rectangles that have four individual folds running perpendicular to the assembled chair's cross section. Four folds separate five panels in the seat span 61, 62, 63, 64, 65. Each of the bookending seat span panels 61, 65 have two single slots 71, 72 and 73, 74 each of width 1 (which corresponds to the thickness of one triple wall fiberboard sheet). Four folds separate five panels in the back span 91, 92, 93, 94, 95. Each of the bookending back span panels 91, 95 have two single slots 81, 82 and 83, 84 each of width 1 (which corresponds to the thickness of one triple wall fiberboard sheet).

Slots 71, 72, 73, 74, 81, 82, 83, 84 on bookending panels are spaced a sufficient distance apart (the difference between panel width 4 and double the distance of slots to edge 5) to prevent torsional rocking of the chair, yet located an adequate distance 5 from the edge of the chair to provide necessary lateral support for the vertical supports.

In one particular embodiment of chair design intended for lounge seating, the sides, slots, and angles of vertical supports have the following dimensions outlined in this table.

| Side | Length (in.) |
| --- | --- |
| 21a | 7 |
| 21b | 17.75 |
| 22 | 7.5 |
| 23 | 15.5 |
| 24 | 15.5 |
| 25 | 14.5 |
| 26a | 18.75 |
| 26b | 3.75 |
| 41a | 7 |
| 41b | 17.75 |
| 42 | 7.5 |
| 43 | 15.5 |
| 44 | 15.5 |
| 45 | 14.5 |
| 46a | 18.75 |
| 46b | 3.75 |

-continued

| Slot | Width (in.) | Depth (in.) | Chamfer (in.) |
| --- | --- | --- | --- |
| 31 | 21/32 | 3 | 0.5 |
| 32 | 21/32 | 3 | 0.5 |
| 33 | 42/32 | 2 | 0.5 |
| 51 | 21/32 | 3 | 0.5 |
| 52 | 21/32 | 3 | 0.5 |
| 53 | 42/32 | 2 | 0.5 |

| Angle between adjacent sides | Degrees |
| --- | --- |
| 21, 22 | 99 |
| 22, 23 | 94 |
| 23, 24 | 111 |
| 24, 25 | 81 |
| 25, 26 | 94 |
| 41 42 | 99 |
| 42, 43 | 94 |
| 43, 44 | 111 |
| 44, 45 | 81 |
| 45, 46 | 94 |

The seat span of this example has the following panel and slot dimensions:

| Panel | Width (4) (in.) | Length (in.) |
| --- | --- | --- |
| 61 | 18 | 6 |
| 62 | 18 | 5 |
| 63 | 18 | 15.25 |
| 64 | 18 | 16.625 |
| 65 | 18 | 4 |

| Slot | Width (in.) | Depth (in.) | Distance from Edge (5) (in.) |
| --- | --- | --- | --- |
| 71 | 9/16 | 3 | 2.5 |
| 72 | 9/16 | 3 | 2.5 |
| 73 | 9/16 | 2 | 2.5 |
| 74 | 9/16 | 2 | 2.5 |

The back span of this particular embodiment has the following panel and slot dimensions:

| Panel | Width (4) (in.) | Length (in.) |
| --- | --- | --- |
| 71 | 18 | 6 |
| 72 | 18 | 8.25 |
| 73 | 18 | 8.25 |
| 74 | 18 | 16.5 |
| 75 | 18 | 4 |

| Slot | Width (in.) | Depth (in.) | Distance from Edge (5) (in.) |
| --- | --- | --- | --- |
| 81 | 9/16 | 3 | 2.5 |
| 82 | 9/16 | 3 | 2.5 |
| 83 | 9/16 | 2 | 2.5 |
| 84 | 9/16 | 2 | 2.5 |

Assembly:

The chair is assembled as follows. The seat span slots 71, 72 are first fitted into the bottom slot joints 31, 51 of the vertical supports 10, 11. The seat span is then wrapped around both vertical supports 10, 11 such that seat span panel 62 is flush with vertical support 10 sides 26b and vertical support 11 side 46b, seat span 63 is flush with vertical support 10 side 25 and vertical support 11 side 45, and seat span panel 64 is flush with vertical support 10 side 24 and vertical support 11 side 44. Slots 73 and 74 in seat span panel 65 are then inserted into the double slots 33 and 53 of vertical supports 10, 11. The back span slots 81, 82 are first fitted into the top slot joints 32, 52 of the vertical supports 10, 11. The back span is then wrapped around both vertical supports 10, 11 such that back span panel 92 is flush with vertical support 10 sides 21a and vertical support 11 side 41a, back span panel 93 is flush with vertical support 10 side 22 and vertical support 11 side 42, and back span panel 94 is flush with vertical support 10 side 23 and vertical support 11 side 43. Slots 83 and 84 in back span panel 95 are then inserted into the double slots 33 and 53 of vertical supports 10, 11.

Variations:

A wide variety of other dimensions, ratios, proportions, scales, and configurations would be possible in other examples, of course.

Figure 3:
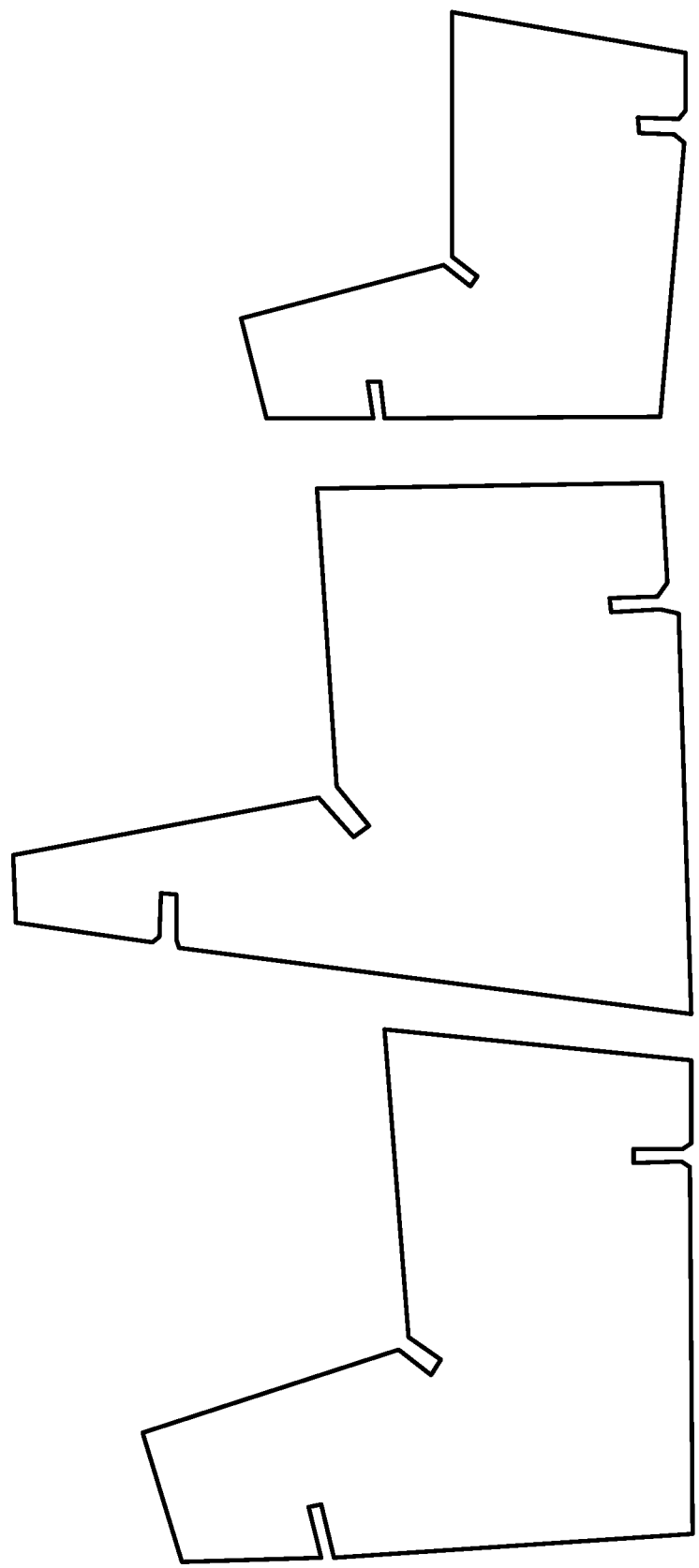
FIG. 3 is cross-sectional view of various chair aspect ratios.
Figure 4:
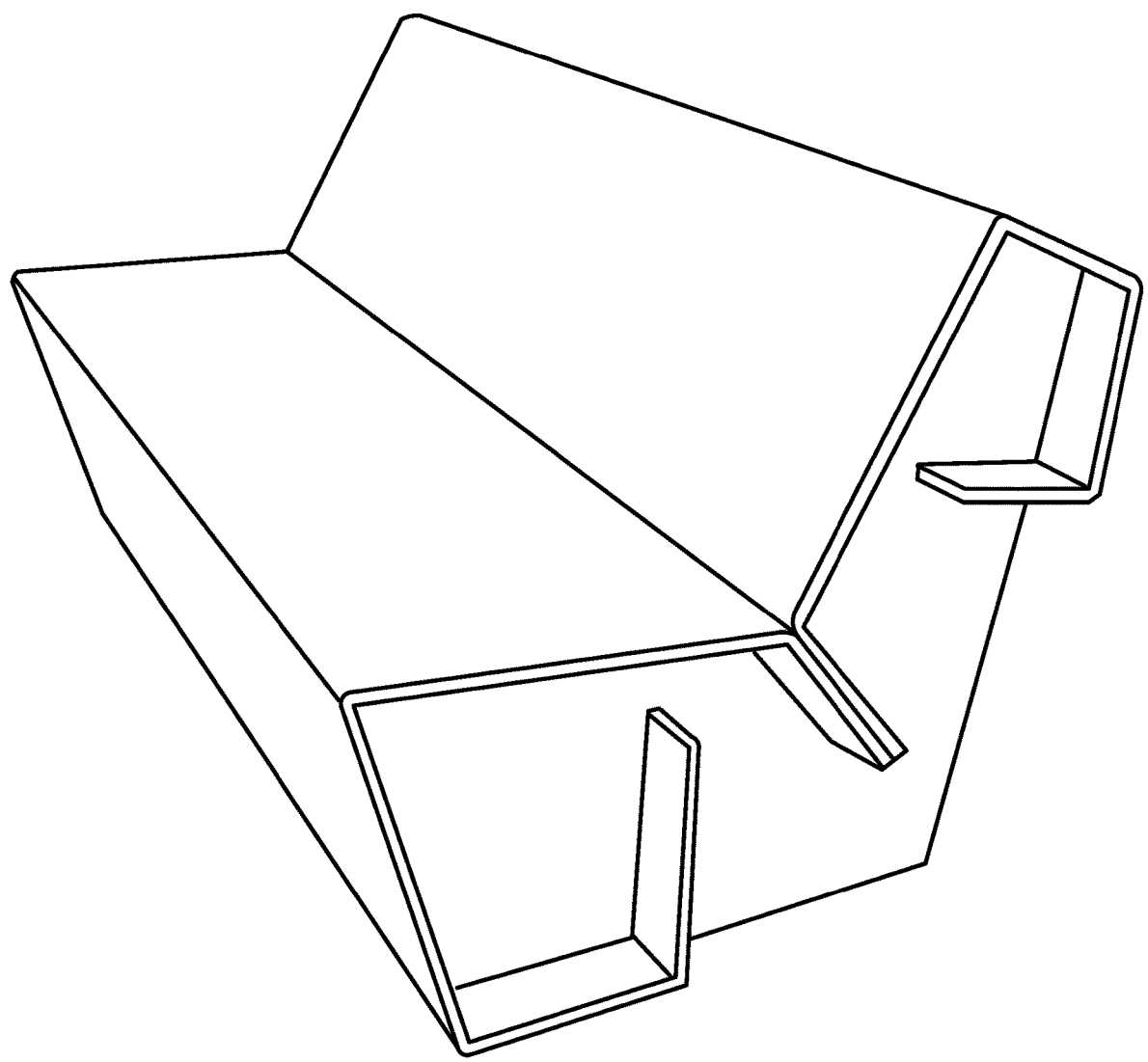
FIG. 4 is an isometric view of an extruded variation of a chair.
Figure 5:
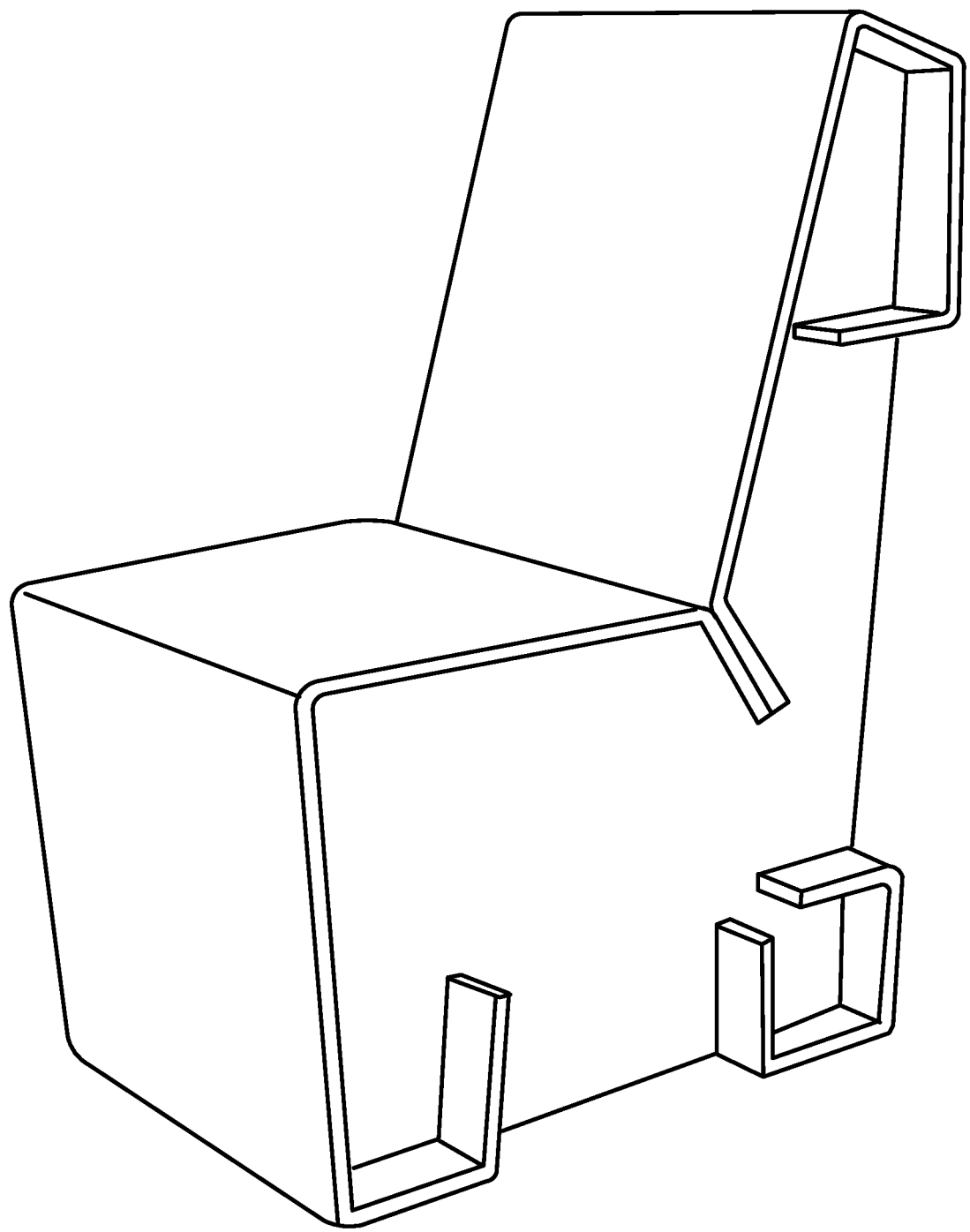
FIG. 5 is an isometric view of a desk chair variation on a chair.

For example, the aspect ratios or scales or both of the chair design may be modified to achieve various functional uses as shown in the three designs in FIG. 3; the lounge chair A, the desk chair B, and the child's chair C. Any seat design may be extruded in length along on the cross section to achieve a wider seat to accommodate two or more people as show in the sofa FIG. 4. To accommodate wider seats, more vertical supports may (likely will) need to be added to achieve structural stability and seat and back spans must be elongated. For example, a sofa may contain three or four (or possibly more) vertical supports spaced out along the sofa's length. The sofa's seat span and back span would reflect this change by having corresponding increase in single slots in panels 61, 65, 91, 95. A seat may also be reinforced by a small brace on the bottom back corner of the seat assembly as shown in the desk chair variation in FIG. 5. This back bracing may further prevent torsion strain and bending strain on the back of the seat's legs, lengthening the life of the desk chair. In the case of the desk chair, back bracing may reduce leg fatigue in high use work environments.

Figure 6:
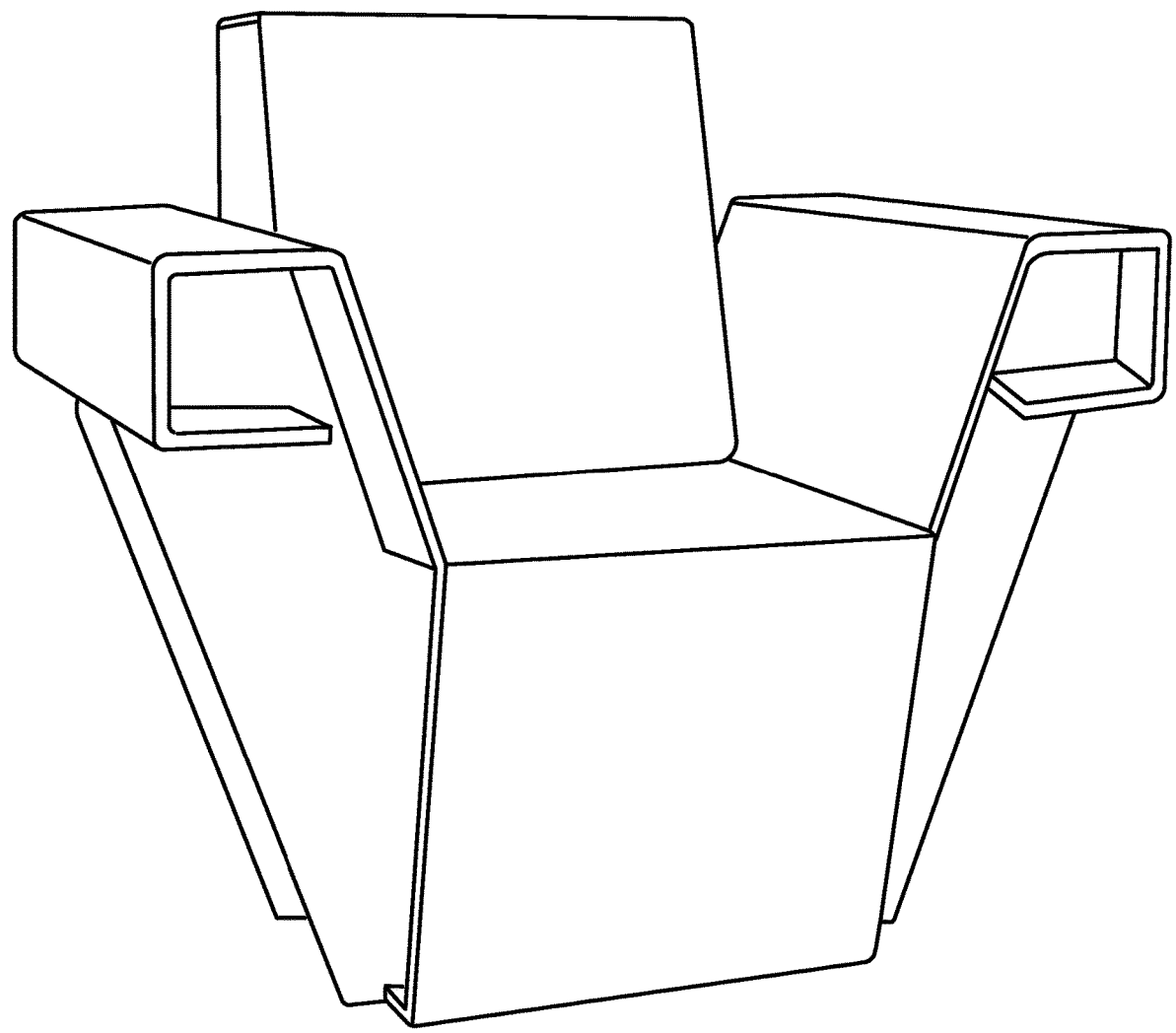
FIG. 6 is an isometric view of an arm chair variation of a chair.
Figure 7:
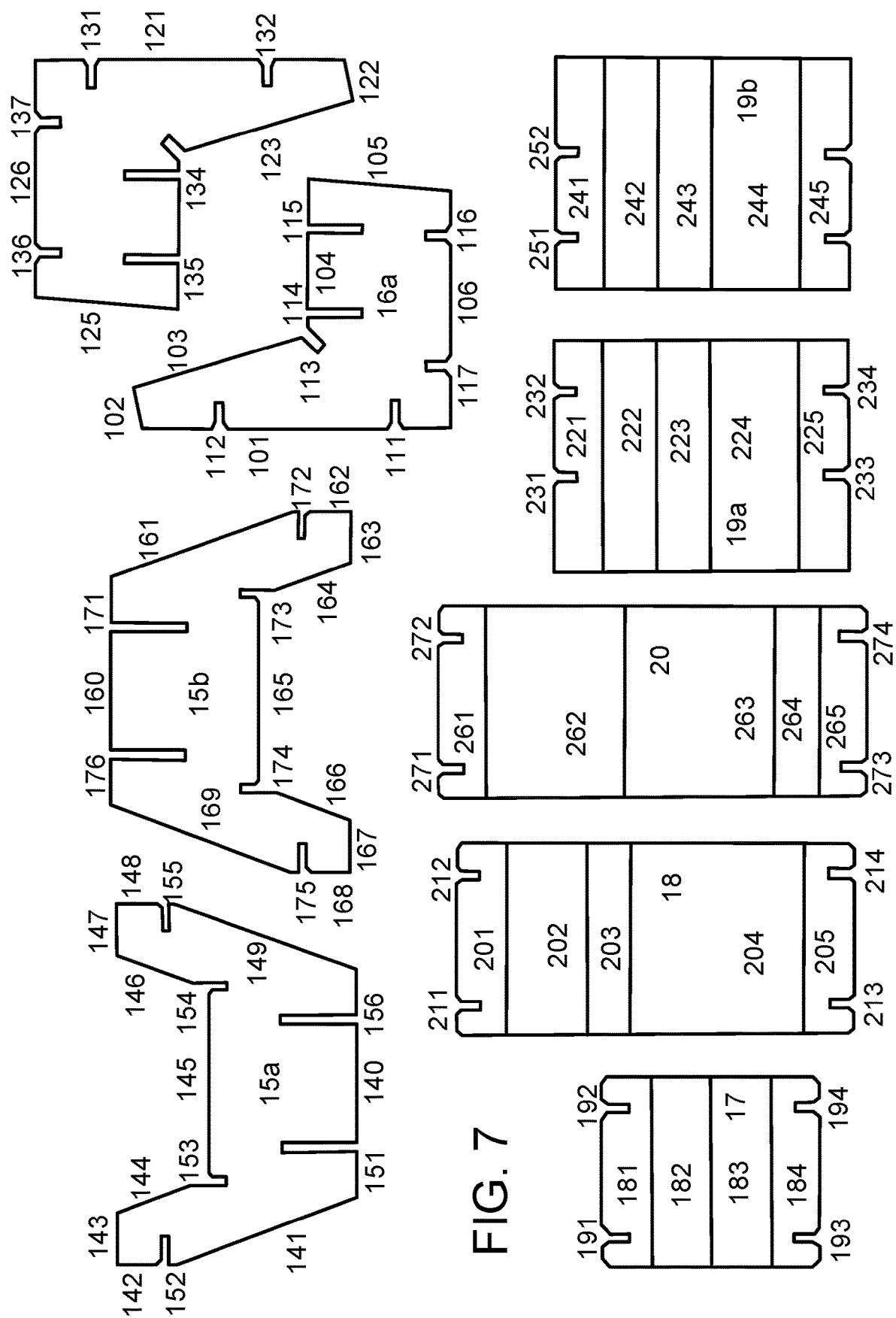
FIG. 7 is a disassembled and unfolded view of parts of the arm chair.

A seat may also be equipped with arms to increase the comfort of the furniture piece as shown in the arm chair seat variation in FIG. 6. Arms can be achieved by adding two additional arm supports 15a, 15b that extend perpendicular to the original seat supports as shown in FIG. 7. To achieve the arms in full structure, arm spans 19a and 19b will wrap and slot into arm supports 15a and 15b.

The disassembled parts of the arm chair variation are shown in FIG. 7 and include two arm supports 15a, 15b, two chair supports 16a, 16b, back brace 17, back span 18, arm spans 19a, 19b, and seat span 20. Arm supports represent a front elevation view of the vertical cross section of the arm chair. Arm supports are U-shaped with ten sides 140, 141, 142, 143, 144, 145, 146, 147, 148, 149, 160, 161, 162, 163, 164, 165, 166, 167, 168, 169 and six slots: 2 receiving slots for the chair supports 151, 156, 171, 176 and 2 outer receiving slots for the arm spans 152, 155, 172, 175 and two inner receiving slots for the arm spans 153, 154, 173, 174. All arm chair slots are wide enough to accept one corresponding slot piece from the chair support or arm spans. Chair supports 16a, 16b are side elevation cross-sectional view of the arm chair. Chair supports are L-shaped with six sides 101, 102, 103, 104, 105, 106, 121, 122, 123, 124, 125, 126 and each with seven slots: one outer receiving slot for the back span 112, 132 one outer receiving slot for the seat span 116, 136, one double slot to receive both back and seat spans 113, 133, two receiving slots for the arm supports 114, 115, 134, 135, and two receiving slots for the back brace 11, 117, 131, 137.

Arm spans are rectangular, each containing five adjacent panels 221, 222, 223, 224, 225, 241, 242, 243, 244, 245 and four slots: two outer receiving slots 231, 232, 251, 252 and two inner receiving slots 233, 234, 253, 254. Back brace 17 is rectangular and both vertical and horizontally symmetrical. Back brace 17 has and has four adjacent panels 181, 182, 183, 184 and four slots 191, 192, 193, 194. Seat and back spans as described previously are rectangular and each contains five adjacent panels and four slots.

The arm chair is assembled as follows: arm supports 15a, 15b are slotted into chair supports 16a, 16b forming a shape resembling the pound sign viewed from a top view. Arm supports slot 151, 156, 171, 176 are fit into chair supports slots 115, 135, 114, 134 respectively. These perpendicular support structures strengthen the arm chair seat. Arm spans 19a, 19b are fitted around arm spans by inserting outer arm span slots 231, 232, 251, 252 into outer arm support slots 152, 172, 155, 175 respectively. Arm spans are folded around arm supports such that panels 222, 242 lie flush with arm support sides 142, 162 and 148, 168 respectively, arm span panels 223, 243 lie flush with arm supports sides 143, 163 and 147, 167 respectively, arm span panels 224, 244 lie flush with arm supports sides 144, 164 and 146, 166 respectively. Inner arm span slots 233, 234, 253, 254 are then fitted into inner arm support slots 153, 173, 154, 174 respectively. Back brace slots 191, 192, insert into top corner slots of chair supports 16a, 16b: 111, 131 and folded around the chair supports such that back brace panel 182 is flush with chair support side 101, 121 and back brace panel 183 is flush with chair support side 106, 126. Back brace slots 193, 194 are fitted into bottom corner slots of chair supports 117, 137. Seat span and back span are assembled as described previously.

Tables

Figure 8:
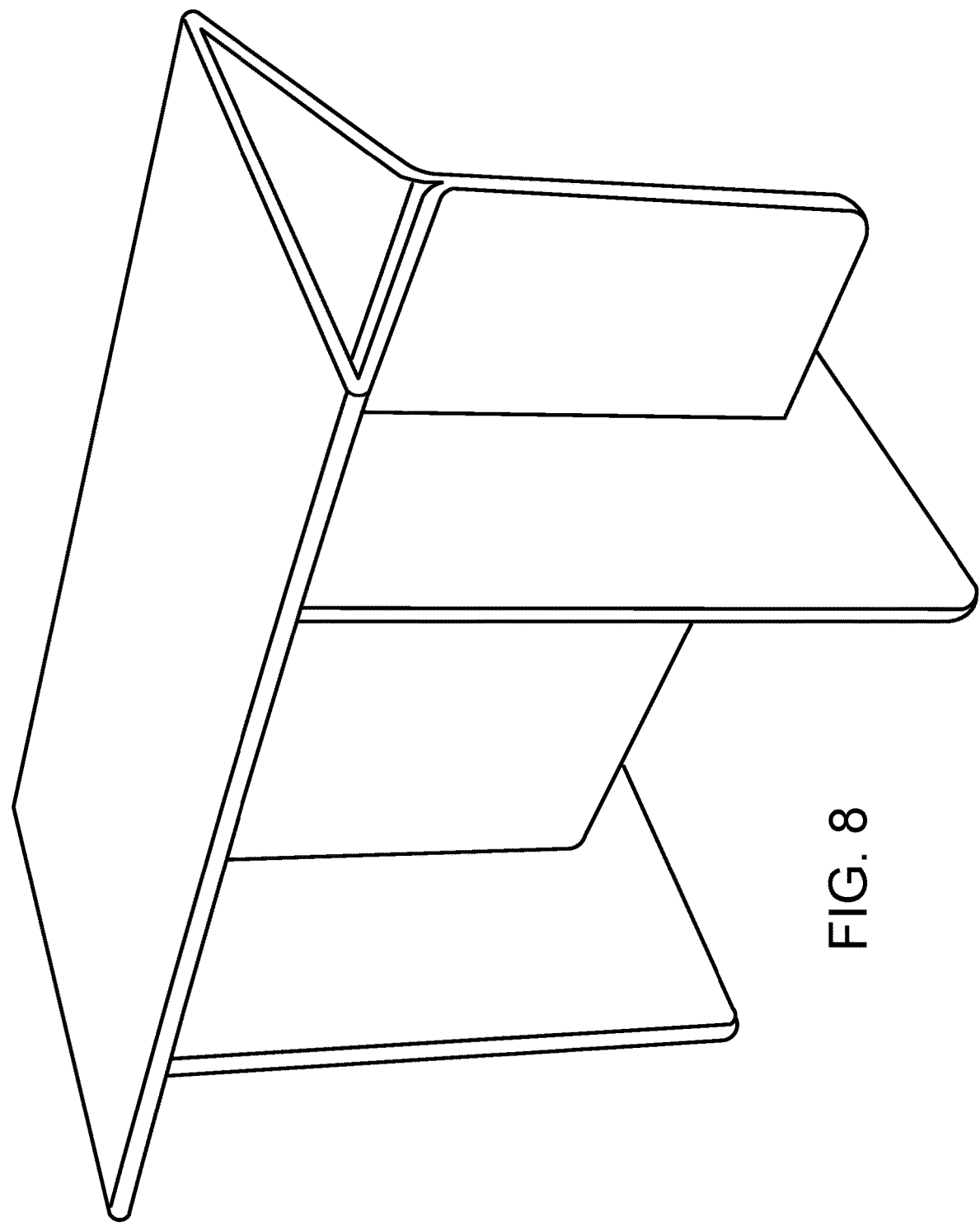
FIG. 8 is isometric view of a table.
Figure 9:
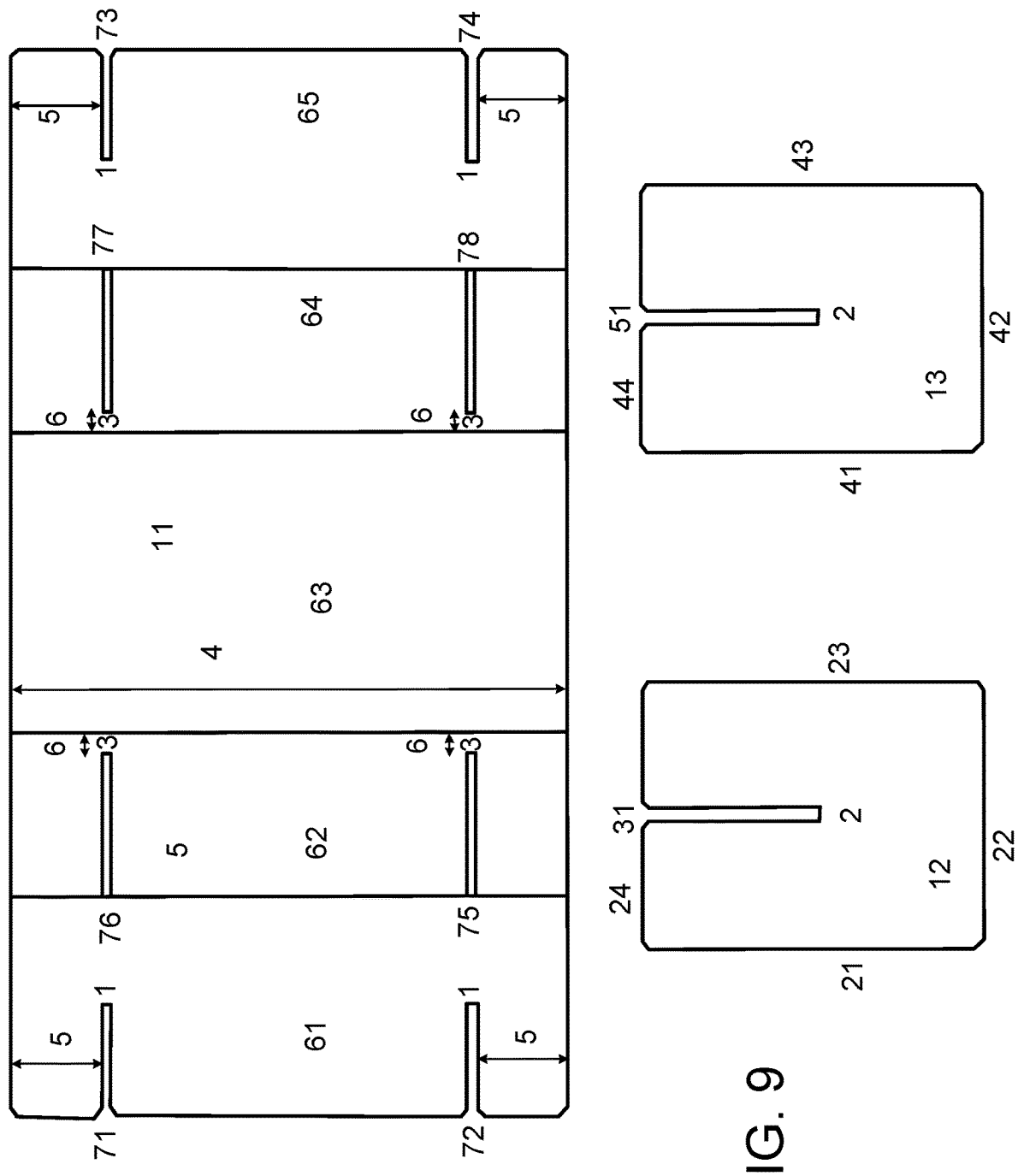
FIG. 9 is a disassembled and unfolded view of parts of the table.

Table Parts:

A simple implementation of a table design is shown in FIG. 8; its disassembled parts are shown in FIG. 9. The table includes three pieces: two identical vertical supports 12, 13 and table top 11. All corners are chamfered to reduce corner crush damage during the lifespan of the product. Each of the vertical supports has four sides and one double slot joint: vertical support 12 has sides 21, 22, 23, 24 and double slots joint 31, vertical support 13 has sides 41, 42, 43, 44 and double slot joint 51.

The table top is a large rectangle that has four individual folds running perpendicular to the plane created by the assembled table's vertical supports. The interior folds, the folds between table top panels 62, 63 and 63, 64, are upwards folds while the outer folds, the folds between table top panels 61, 62 and 64, 65, are downwards folds. These opposite directional folds afford an I-beam like structure in the final table assembly, resembling an extruded triangular prism. The table top has eight slots, four exterior slot joints 71, 72, 73, 74 of width 1 located on bookending panels 61, 65 on the table top and four interior slot pathways 75, 76, 77, 78 of width 3 located on interior panels 64, 62 on the table top. Exterior slot joints are locate a sufficient distance from the edge of the table 5 to provide adequate lateral support for the vertical supports of the assembled table. Interior slot pathways 75, 76, 77, 78 are truncated a sufficient distance 6 before reaching panel 63 as to prevent interruption and weakening of interior folds and exterior slot joints 71, 72, 73, 74 are located a sufficient distance apart (table top width 4 minus double the distance of the slots to the table top edge 5).

In one particular embodiment of table design intended for desk use, the panels of the table top have the following dimensions:

| Panel | Width (4) (in) | Length (in) |
|---|---|---|
| 61 | 48 | 19 |
| 62 | 48 | 14 |
| 63 | 48 | 26 |
| 64 | 48 | 14 |
| 65 | 48 | 19 |

This table top intended for desk use has the following slot dimensions:

| Slot | Width (in) | Depth (in) | Distance from Edge (5) (in) | Distance before reaching table top middle panel 63 (in) |
|---|---|---|---|---|
| 71 | 9/16 | 9.5 | 10 | NA |
| 72 | 9/16 | 9.5 | 10 | NA |
| 73 | 9/16 | 9.5 | 10 | NA |
| 74 | 9/16 | 9.5 | 10 | NA |
| 75 | 11/16 | 12.5 | 10 | 1.5 |
| 76 | 11/16 | 12.5 | 10 | 1.5 |
| 77 | 11/16 | 12.5 | 10 | 1.5 |
| 78 | 11/16 | 12.5 | 10 | 1.5 |

The desk has the following leg side dimensions and leg slot dimensions:

| Side | Length (in) |
|---|---|
| 21 | 29 |
| 22 | 23 |
| 23 | 29 |
| 24 | 23 |
| 41 | 29 |
| 42 | 23 |
| 43 | 29 |
| 44 | 23 |

| Slot | Width (in) | Depth (in) | Distance from Edge (in) |
|---|---|---|---|
| 31 | 29 | 10.5 | 11.5 |
| 51 | 23 | 10.5 | 11.5 |

Table Assembly:

The table is assembled as follows. The table top, 11, interior folds are folded upwards and the exterior folds are folded downwards. Table top panels 61,65 are then brought together such that they are flush and that single slots 71,72 align with single slots 73,74. Table top panels 62,63,64 form a triangular prism that affords the table resistant to bending forces. Table top panels 61,65 provide an extension of this triangular prism beam to interlock with vertical supports. Double slot 31 in vertical support 12 is then inserted to paired single slots 71,73. Vertical support 12 is pushed through such that vertical support side 24 passes through paired slot pathways 76,77 until it lies flush with table top panel 63. Likewise, double slot 51 in vertical support 13 is then inserted to paired single slots 72,74. Vertical support 13 is pushed through such that vertical support side 44 passes through paired slot pathways 75,78 until it lies flush with table top panel 63. The slot pathways allow vertical supports to directly support table top panel 63, the consumer's work surface. Interior folds resist upward bending creating separation forces between paired single slot joints 71,73 and slot joints 72,74. These separation forces increase friction in double slots 31,51 of vertical supports and afford resistance to wobbling and greater structural strength. Table top slot joints 71, 72, 73, 74 are of adequate length to provide necessary lateral support for the table in the direction parallel to the table top folds. Opposite folding directions of interior and exterior folds allow for efficient and compact flat packing of the table design for both storage and shipping.

Table Variations:

A wide variety of other dimensions, ratios, proportions, scales and configurations would be possible in other examples, of course.

Figure 12:
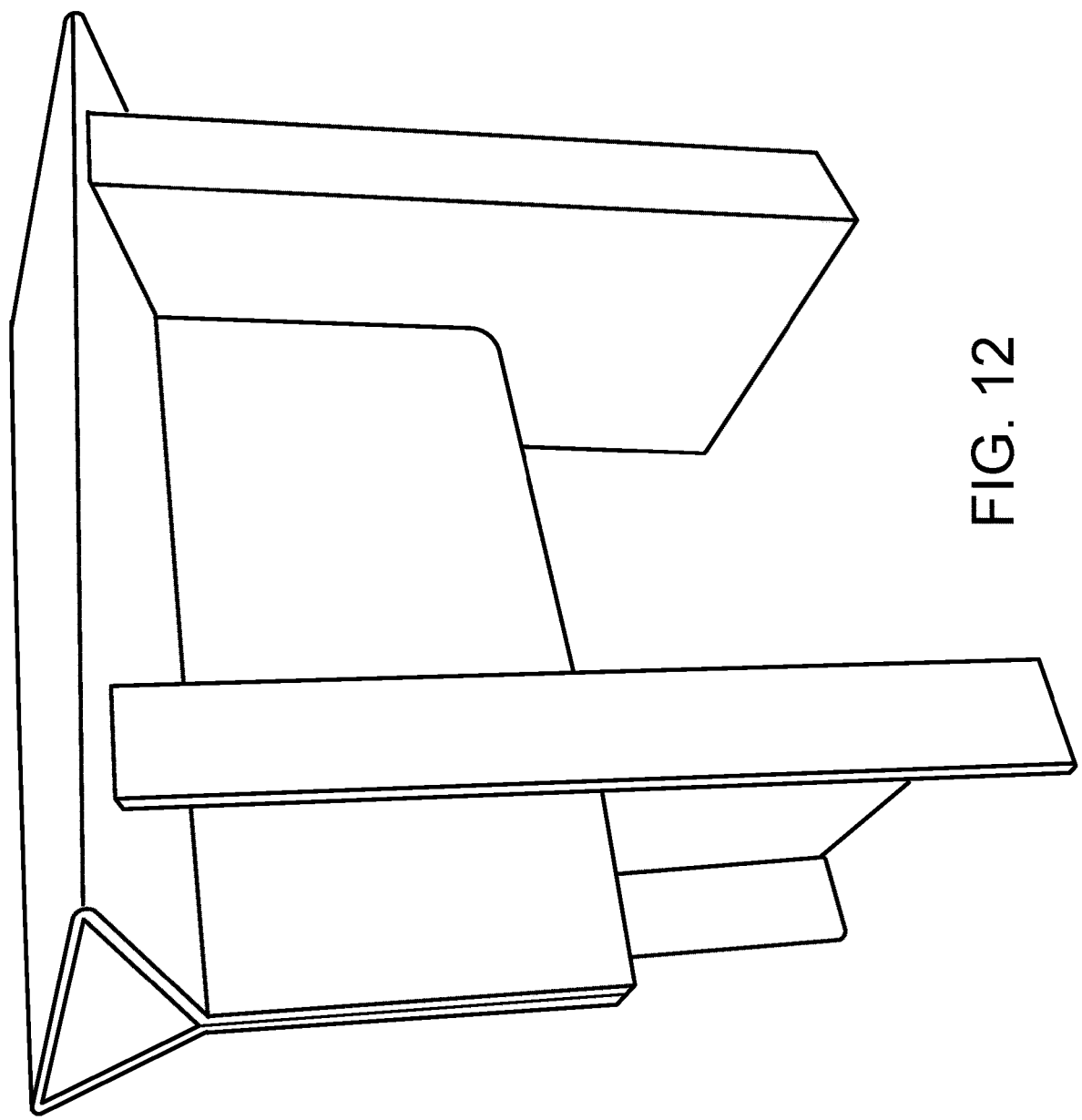
FIG. 12 is a disassembled and unfolded view of parts of the standing desk.

The aspect ratio or scale of the disclosed table design may be varied for a variety of other uses. FIG. 10 shows three different table designs, a coffee table A, desk B, and standing desk C achieved by variation of the same basic table design template. The coffee table A has shorter legs and a wider table top panel 63. To accommodate this, coffee table legs are proportionally wider; the outer table top panels 61, 65 are shorter with corresponding shorter single slot joints 71, 72 and 73, 74. The standing desk as shown disassembled in FIG. 13 has longer legs with two additional panels 122, 124 on each table leg separated by vertical folds to form outwardly facing c-shape leg structures as shown assembled in FIG. 12. To accommodate these c-shape leg supports 17 in FIG. 13, single slot pathways are converted into L-shaped pathways 95, 96, 97, 98 in the standing desk table top 14. L-shaped pathways are formed by carving slot pathways perpendicular to and on outside of pre-existing slot pathways.

A longer table may be achieved by increasing the length of the table top triangular prism. A longer table may require more structural support and therefore may necessitate additional vertical leg supports spaced at intervals underneath the structure. To accommodate additional leg supports, the table top will need corresponding single slot joints and single slot pathways at the locations of the additional vertical leg supports. Additional variations on table design may be achieved by adding various shelving configurations to the existing table design. Horizontal slots may be cut into table legs in order to accept rectangular shelves with corresponding slots. Shelving may also be achieved for the standing desk by cutting horizontal slots that pass through table top panels 61,65 as well as through the c-shaped outwardly facing leg structure.

Figure 11:
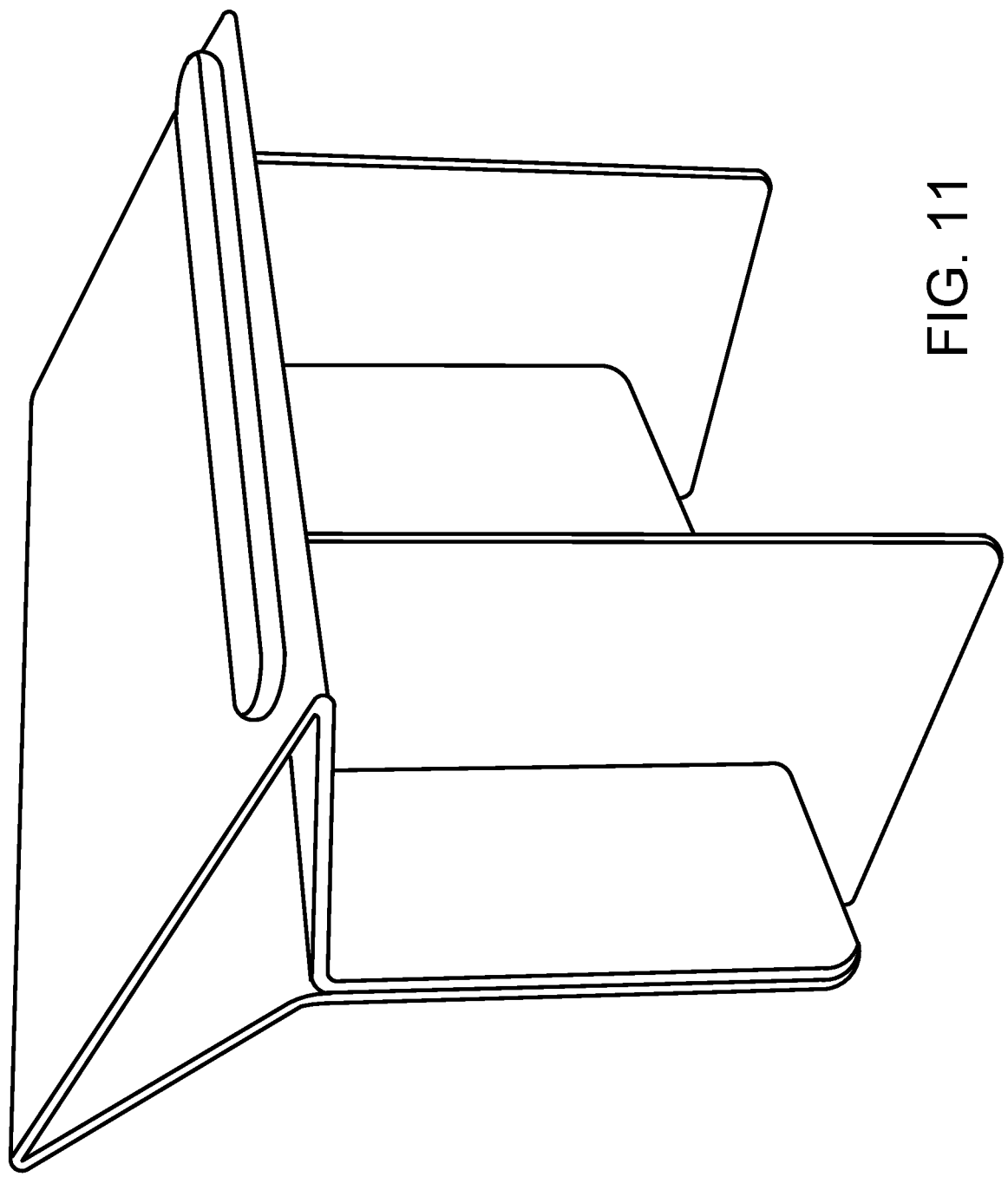
FIG. 11 is an isometric view of a standing desk variation of a table.
Figure 13:
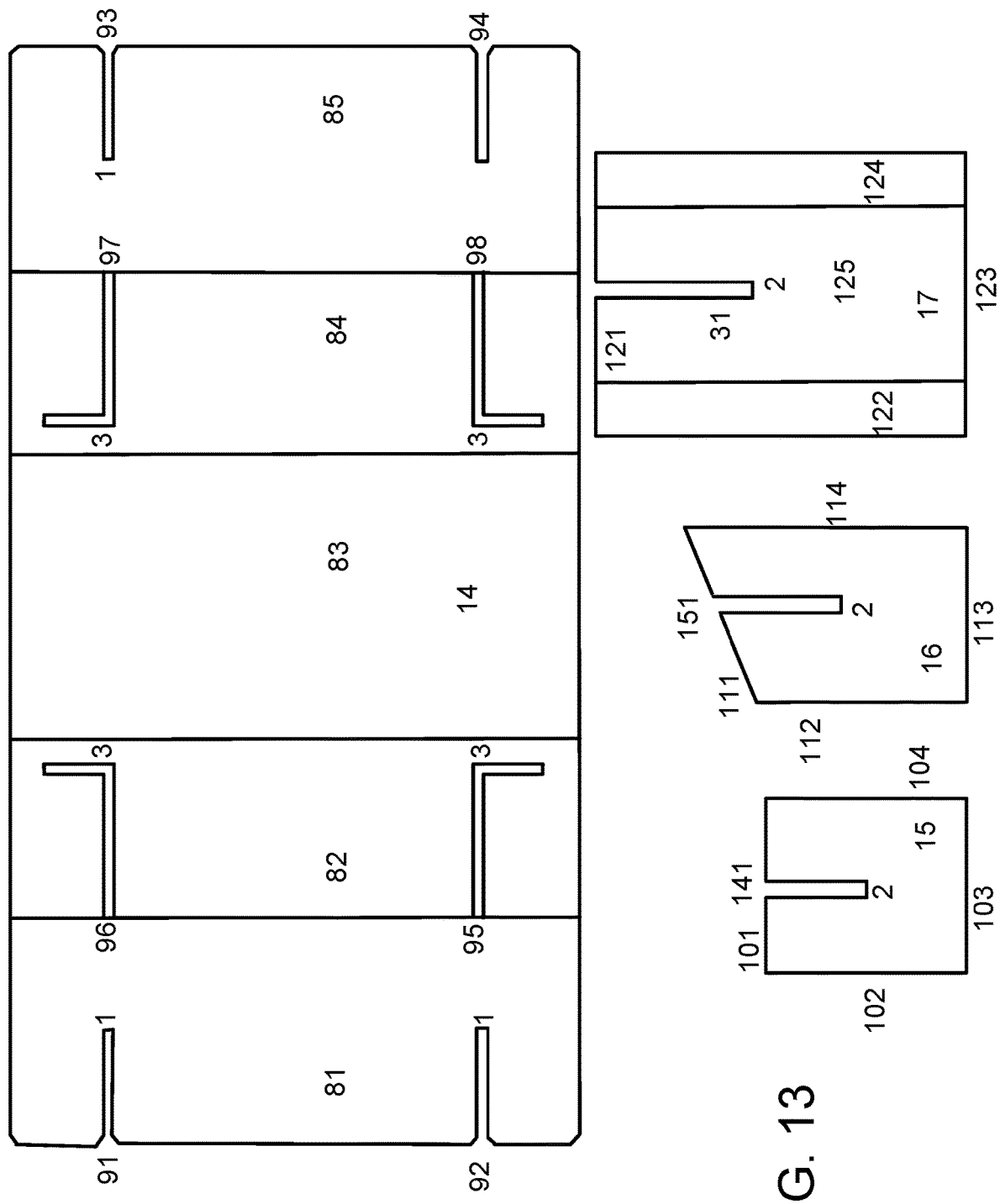
FIG. 13 is a cross sectional view of various table aspect ratios.

Additionally, table legs sides 24 and 44 may be cut at an acute angle with respect to table sides 22, 42 in FIG. 9 to achieve a drafting table configuration as shown in FIG. 11 with resulting table leg 16 side 11 shown in FIG. 13. To accommodate angled legs, the table top panel 63 would rest parallel to inclined table sides 111 and provide an angled surface for the table user.

Manufacturing:

In some examples, the pieces that are assembled to make the furniture and furnishings can be fabricated from 9/16 inch thick triple wall corrugated (for example, the 99 ECT AAC fluted 4 ft by 8 ft triple wall sheets available from Norampac in Schenectady, N.Y.).

Figure 14A:
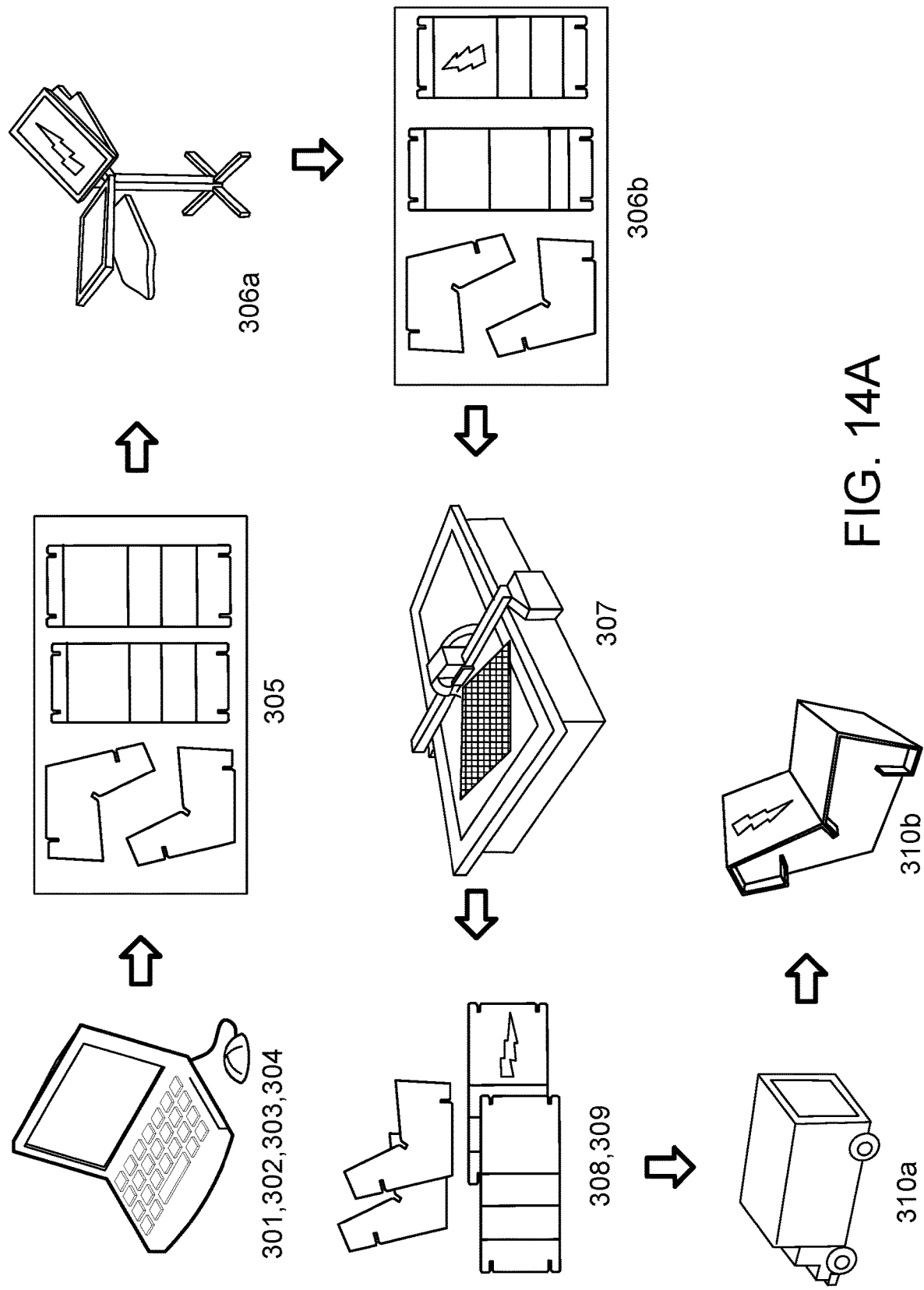
FIGS. 14a and 14b are block and textual flow charts representing a customization and manufacturing process for a corrugated furniture piece.
Figure 14B:
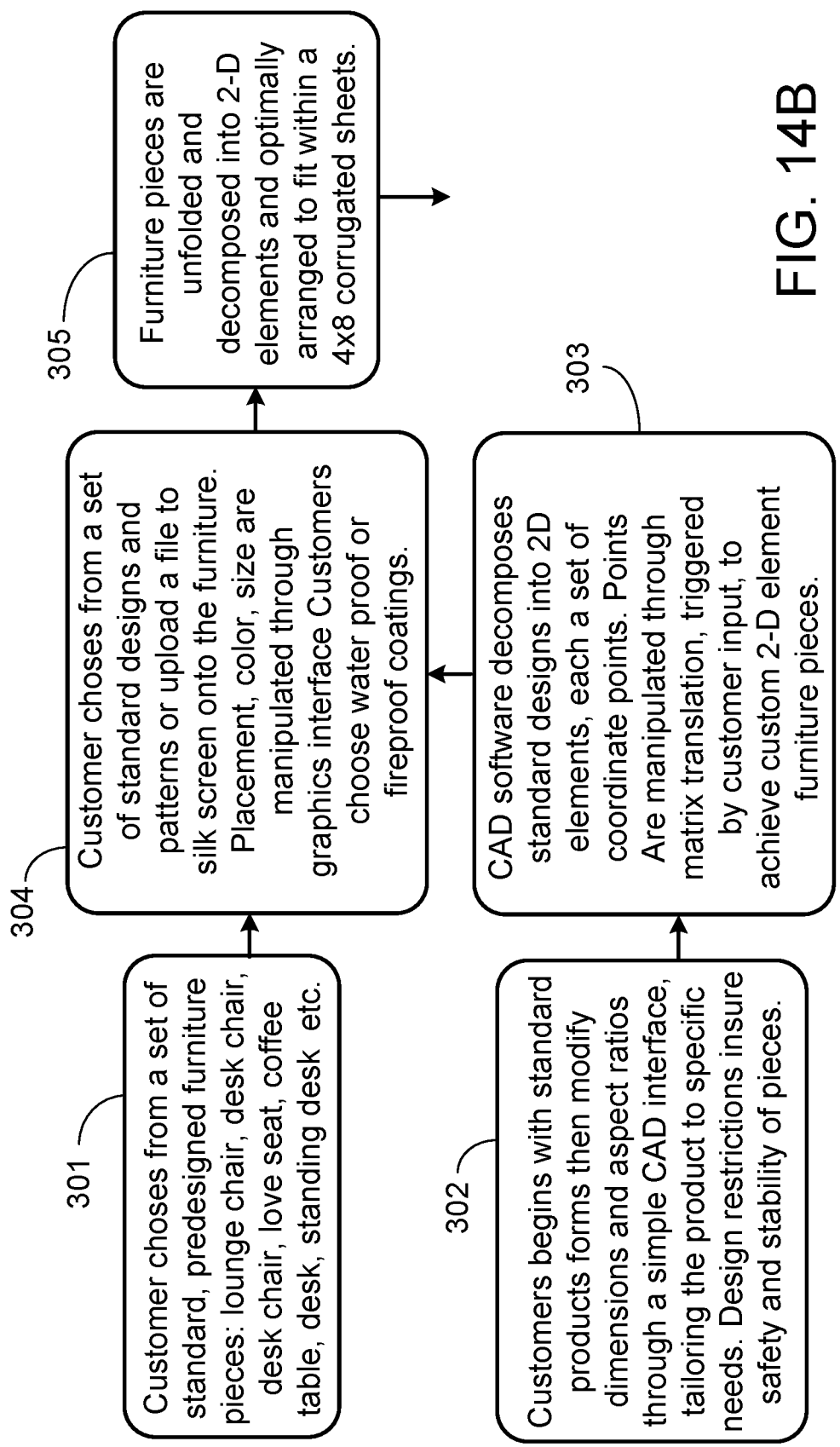
Figure 14B:
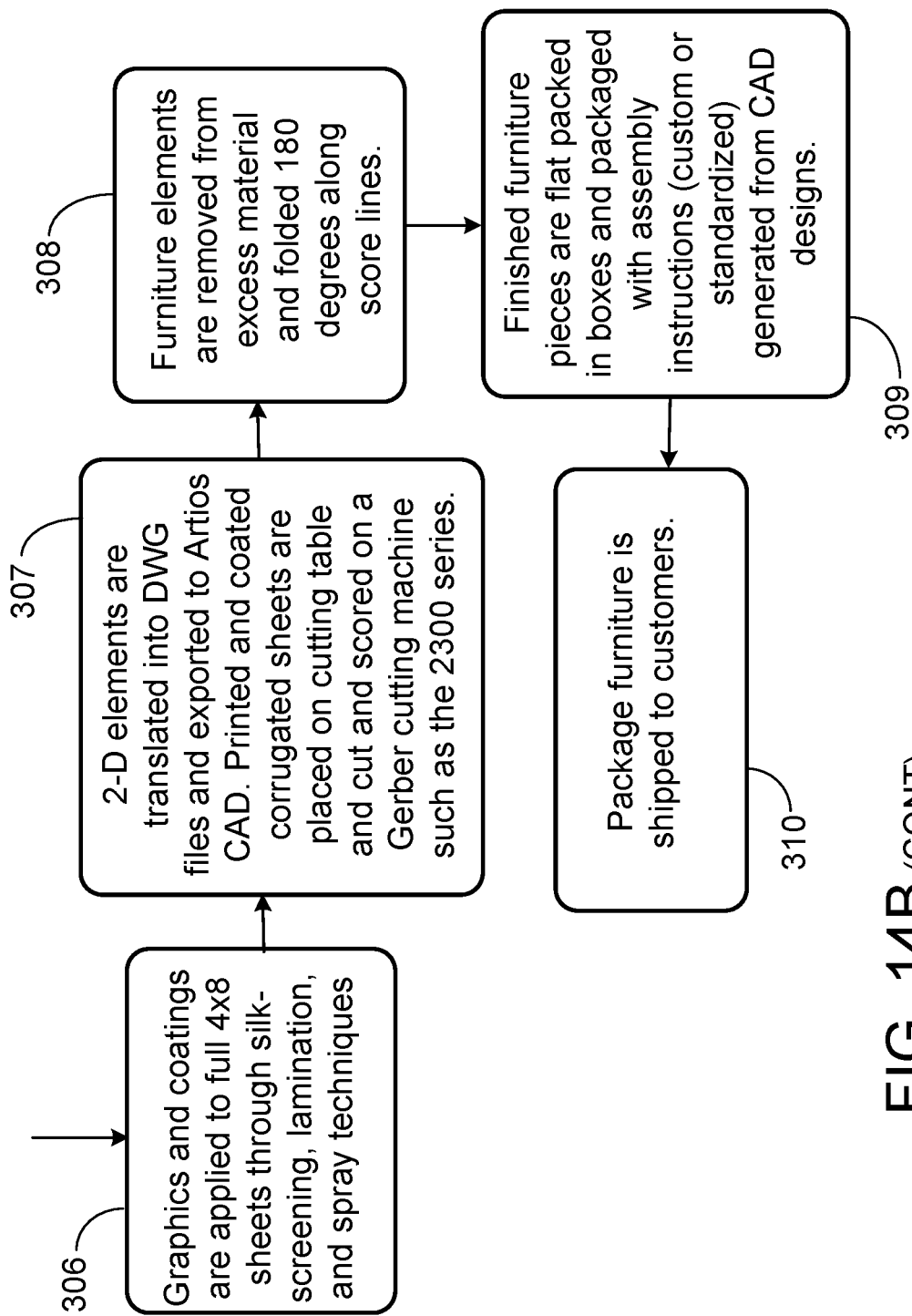

As shown in FIGS. 14a and 14b, in some cases, prior to cutting the pieces for a piece of furniture, the customer begins by choosing from a set of standard seating and table designs 301. These standard seating and table designs are represented by basic standard templates for the pieces that will be cut and later assembled. The customer then can choose to decorate standard or customized furniture designs through an online interface, for example, presented in a web browser, by uploading graphics, choosing from pattern and color libraries, or entering text, or any combination of those 304. In some cases customers can choose from pre-existing available designs. In some cases, customers can also modify standard designs, tailoring the product to a specific need 302, 303. Customers may also choose to have the furniture coated with water or fire resistant coatings. Designs that are to be realized in 3D are decomposed by a computer into 2D elements such that all graphics and colors are then printed on a single side of a 4×8 sheet of cardboard 305. Corrugated fiberboard sheets are then inserted into a screen printer and all graphics and then all coatings are applied to the C-flute side of the material in exact trace locations of parts 306. Printed sheets are inserted into a Gerber 2300 series cutting table where they are cut and scored according to CAD template specifications chosen by the customer 307. Furniture elements are then removed from excess materials (which are recycled for example) and folded 180 degrees along score lines, later to be flat packed in boxes with assembly instructions from CAD designs 308,309. Finally packaged furniture is shipped to the customer for full assembly 310.

Both the cutting and scoring of a piece of triple wall can be done using a cutting table equipped with an oscillating blade and scoring wheel. (For example, Model series 2300 Gerber cutting table available from Gerber Technology in Toland Conn.) The Gerber cutting table accepts vector files generated from CAD software and translates these files into tool pathways. Servos attached to a table bed and a gliding arm along with a feedback vision system guide the x and y position of a cutting blade and a creasing wheel to both cut and score material on the table's cutting bed according to prescribed distances indicated in vector files. Vector files also indicate when tooling operations must change from cutting to scoring functions. The use of such a cutting machine provides the opportunity to continually and efficiently produce the pieces needed for each seating and table furniture designs. By changing aspect ratios and scales of these designs, various furniture functions can be achieved and tailored to a customer's needs. The cutting machine permits lot-of-one manufacturing of one design immediately followed by another design, or multiple item runs of a single design.

For each piece, a standard triple wall sheet is placed on the cutting table. This sheet may be used untreated from the corrugated plant, pre-sprayed with water proof or fire proof coatings, or pre-silkscreened with graphics or logos, or any combination of them. The triple wall sheet is placed on the cutting in an orientation such that all folds to be made are parallel to the lengths of the corrugations and so that all verticals support structures, whether seating or tables also have the corrugations running along the vertical lengths of the pieces. An oscillating blade is used rather than a carbide knife in order to achieve clean curves and softer edges that do not produce paper cuts.

Customization

Figure 15:
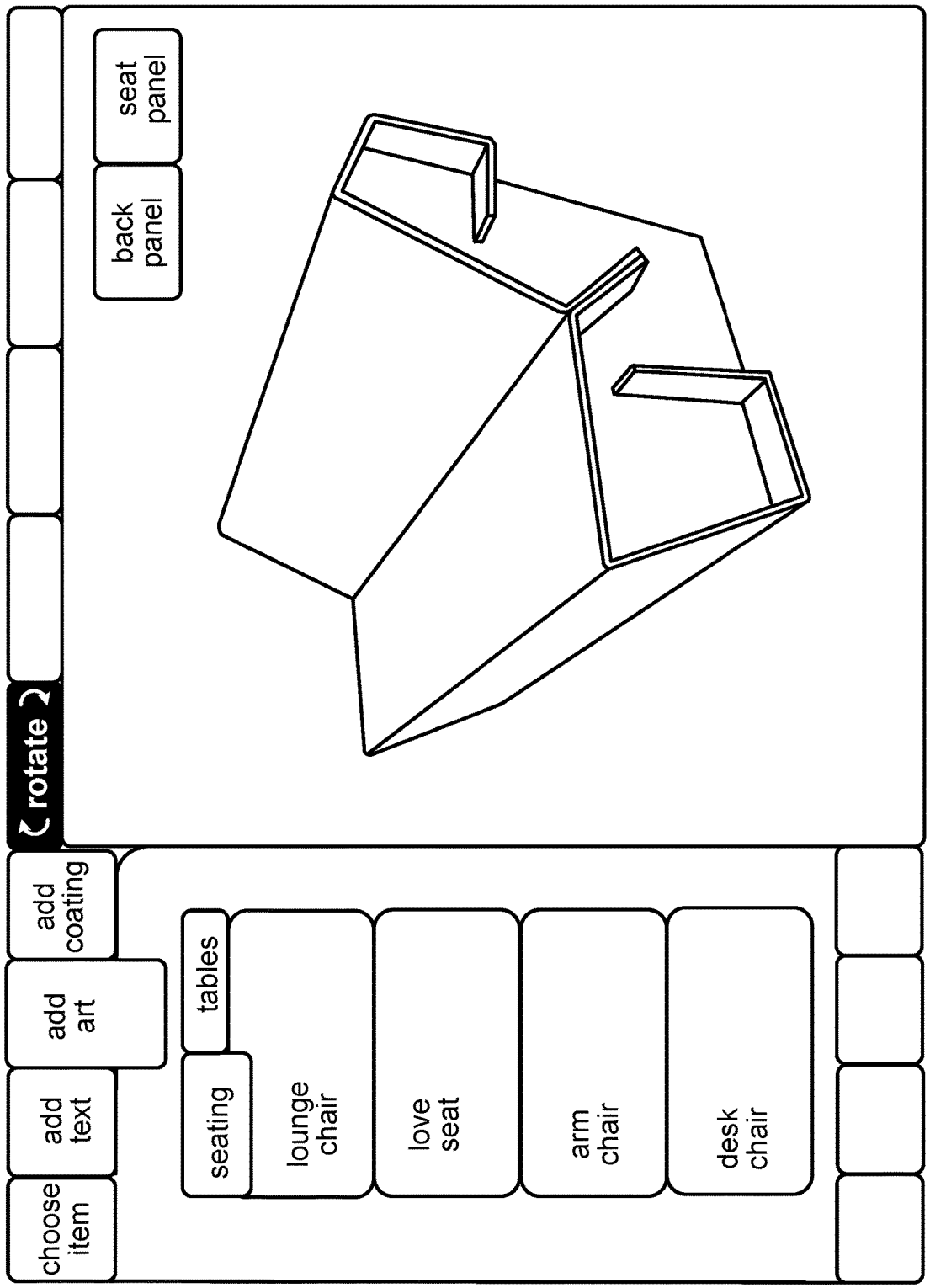
FIG. 15 is a screen shot of a user interface of cardboard furniture customization software depicting standard design choices.
Figure 16:
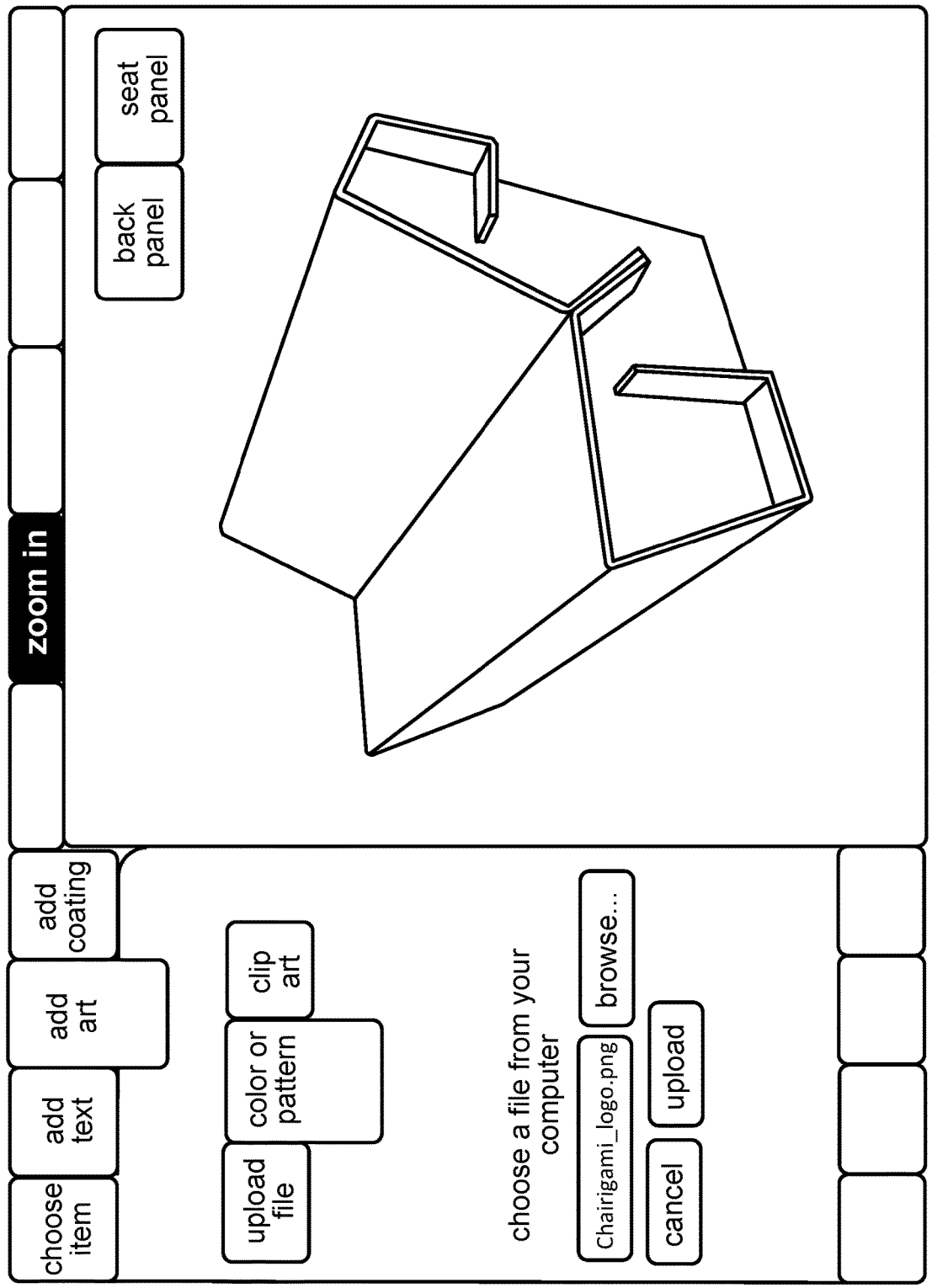
FIG. 16 is a screen shot of a user interface of cardboard furniture customization software depicting design file uploads.
Figure 17:
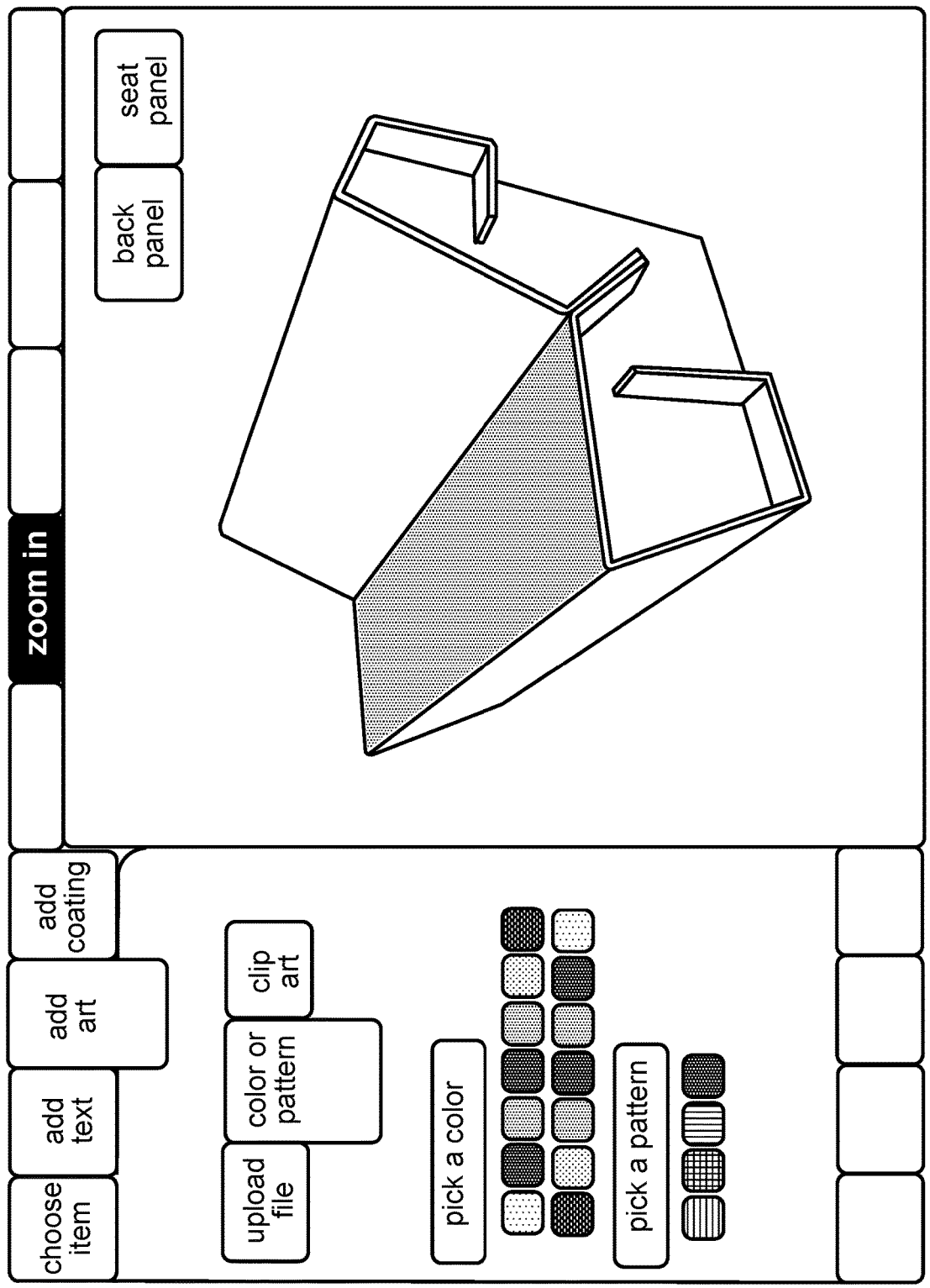
FIG. 17 is a screen shot of a user interface of cardboard furniture customization software depicting furniture color and pattern choices.

As an example of possible user interfaces, FIGS. 15-17 show screen shots of an online web-browser interface which allows customers to personalize and customize standard furniture template designs. The software leads the customer through a tree of design decisions. As shown in FIG. 15 the customer begins by choosing from a set of standard seating or table designs under the choose item tab. In this figure, the customer has selected the seating tables and has chosen to personalize a love seat. FIG. 16 shows that a customer who has opened the add art tab has chosen to upload a custom graphic into the software and place it on the back of the love seat. At any point the customer can save a design, obtain a price quote on the furniture piece, purchase the piece, or elect to view other popular design ideas from other customers. FIG. 17 shows a customer exploring the color and pattern tab and electing to change the seat color. The interface also allows the customer to rotate the personalized piece, zoom in and out, and select the exact furniture facing unto which the graphic, color, pattern, or text will be applied. The customer may choose a water or fire resistant coating to add to the furniture after completing the design. The result is a furniture product that is customized and yet safe, durable, and balanced, and will cater to a customer's body type, life style or design sensibility.

Thus, through the interface, a customer can select a category of furniture, then select a basic design with the category, then choose modifications to the basic design, including changes to aspect ratios, scales, and additional features such as arms for chairs and tables with additional shelving options of seating and table designs, and then select custom graphics or text or finishes that can be applied to the furniture. This online interface interprets the customer design decisions and reformats the basic furniture CAD design to fit the customer's needs, while maintaining restrictions to achieve acceptable levels of safety strength and balance. Once the design has been completed logos and texts are first printed using standard screen-printing techniques on large sheets of triple wall. These sheets are the inserted into cutting tables and then cut and scored based upon the customized CAD drawings. The result is a furniture product that is customized and yet safe, durable, and balanced, and will cater to a customer's body type, life style or design sensibility.

Other implementations are also within the scope of the following claims.

For example, similar principles can be used for the design and manufacture of objects other than furniture, including accessories, furnishings, novelties, promotional items, retail displays, and others.

What is claimed is:

1. An apparatus comprising
three separate pieces of cut flat cardboard,
a first one of the pieces having a bottom edge to be supported from a floor, the first piece rising from the bottom edge and having at least one slot at an upper edge of the first piece,
a second one of the pieces having a bottom edge to be supported from the floor, the second piece rising from the bottom edge and having at least one slot at an upper edge of the second piece,
a third one of the pieces having outer edges that define a continuous closed boundary perimeter of the piece, a crease across the piece, at least two slots along at least one of the outer edges that does not intersect the crease, and a third slot along another one of the outer edges that also does not intersect the crease,
the one slot in the first piece to mate with one of the two slots along the one of the outer edges of the third piece, and the one slot in the second piece to mate with the other one of the two slots along the one of the outer edges of the third piece, the third slot of the third piece mating with the one slot of the first piece or the one slot of the second piece, to form, with the third piece folded along the crease, a piece of furniture in which the first and second pieces serve as legs and the third piece as a surface supported by the legs.

2. The apparatus of claim 1 in which the surface supported by the legs comprises a seating surface.

3. The apparatus of claim 1 in which the surface supported by the legs comprises a work surface.

4. The apparatus of claim 1 in which the cardboard for each of at least one of the pieces comprise triple wall fiberboard.

5. The apparatus of claim 1 in which the third piece of cardboard has two or more creases.

6. The apparatus of claim 1 in which at least one of the first and second pieces of cardboard rises vertically from the bottom edge.

7. The apparatus of claim 1 in which the surface of the third piece lies horizontally.

8. The apparatus of claim 1 in which the bottom edge of the first piece and the bottom edge of the second piece are in direct contact with the floor.

9. The apparatus of claim 1 in which the surface of the third piece lies at an angle relative to the floor.

10. The apparatus of claim 1 in which the outer edge of the third piece is parallel to the crease.

11. The apparatus of claim 1 in which the apparatus is self-supporting without any separate fasteners when the three pieces of cardboard are assembled at the slots.

12. The apparatus of claim 1 comprising a chair.

13. The apparatus of claim 1 comprising a desk or table.

14. The apparatus of claim 1 comprising one or more additional pieces to brace the legs.

* * * * *